US011690237B2

United States Patent
Sakii et al.

(10) Patent No.: US 11,690,237 B2
(45) Date of Patent: Jun. 27, 2023

(54) FIELD EFFECT-TRANSISTOR, METHOD FOR MANUFACTURING SAME, WIRELESS COMMUNICATION DEVICE USING SAME, AND PRODUCT TAG

(71) Applicant: TORAY INDUSTRIES, INC., Tokyo (JP)

(72) Inventors: Daisuke Sakii, Otsu (JP); Seiichiro Murase, Otsu (JP); Junji Wakita, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 804 days.

(21) Appl. No.: 16/630,759

(22) PCT Filed: Sep. 25, 2018

(86) PCT No.: PCT/JP2018/035275
§ 371 (c)(1),
(2) Date: Jan. 13, 2020

(87) PCT Pub. No.: WO2019/065561
PCT Pub. Date: Apr. 4, 2019

(65) Prior Publication Data
US 2021/0083214 A1 Mar. 18, 2021

(30) Foreign Application Priority Data
Sep. 29, 2017 (JP) .............................. JP2017-189900

(51) Int. Cl.
| | |
|---|---|
| *H10K 10/46* | (2023.01) |
| *C08K 3/04* | (2006.01) |
| *C08K 3/08* | (2006.01) |
| *C08K 3/22* | (2006.01) |
| *G06K 19/07* | (2006.01) |
| *C08G 77/00* | (2006.01) |
| *C08G 77/22* | (2006.01) |
| *H01L 29/786* | (2006.01) |
| *C08G 77/28* | (2006.01) |
| *C08G 77/14* | (2006.01) |

(52) U.S. Cl.
CPC ........... *H10K 10/478* (2023.02); *C08G 77/22* (2013.01); *C08G 77/28* (2013.01); *C08G 77/80* (2013.01); *C08K 3/041* (2017.05); *C08K 3/08* (2013.01); *C08K 3/22* (2013.01); *G06K 19/0723* (2013.01); *H01L 29/78696* (2013.01); *C08G 77/14* (2013.01); *C08K 2003/0806* (2013.01); *C08K 2003/2237* (2013.01); *C08K 2201/011* (2013.01)

(58) Field of Classification Search
CPC .................................................. H01L 51/0537
See application file for complete search history.

(56) References Cited

U.S. PATENT DOCUMENTS

| | | | |
|---|---|---|---|
| 2010/0051917 A1* | 3/2010 | Kippelen | H01L 51/0537 257/E51.027 |
| 2011/0001190 A1* | 1/2011 | Ide | H10K 10/471 556/400 |
| 2016/0155968 A1 | 6/2016 | Lee et al. | |
| 2016/0347969 A1 | 12/2016 | Lee et al. | |
| 2017/0285477 A1 | 10/2017 | Tanigaki et al. | |
| 2018/0327530 A1 | 11/2018 | Wakita et al. | |
| 2019/0027700 A1 | 1/2019 | Shimizu et al. | |
| 2019/0378998 A1 | 12/2019 | Sakii et al. | |

FOREIGN PATENT DOCUMENTS

| | | | |
|---|---|---|---|
| EP | 2259289 A1 | | 12/2010 |
| EP | 2975649 A1 | | 1/2016 |
| JP | 2007-256782 A | | 10/2007 |
| JP | 2008-130910 A | | 6/2008 |
| JP | 2011-186069 A | | 9/2011 |
| JP | 2013-115162 A | | 6/2013 |
| JP | 2016-128559 A | | 7/2016 |
| KR | 2007-0121892 A | * | 12/2007 |
| WO | WO 2009/116373 A1 | | 9/2009 |
| WO | WO 2017/090559 A1 | | 6/2017 |
| WO | WO 2017/130836 A1 | | 8/2017 |

OTHER PUBLICATIONS

Machine translation of KR 2007-0121892 (no date).*
Extended European Search Report for European Application 18862713.7, dated Jun. 1, 2021.
International Search Report, issued in PCT/JP2018/035275, PCT/ISA/210, dated Dec. 18, 2018.
Written Opinion of the International Searching Authority, issued in PCT/JP2018/035275, PCT/ISA/237, dated Dec. 18, 2018.

* cited by examiner

*Primary Examiner* — Marc S Zimmer
(74) *Attorney, Agent, or Firm* — Birch, Stewart, Kolasch & Birch, LLP

(57) ABSTRACT

A field-effect transistor including at least: a substrate; a source electrode; a drain electrode; a gate electrode; a semiconductor layer in contact with the source electrode and with the drain electrode; and a gate insulating layer insulating between the semiconductor layer and the gate electrode, wherein the semiconductor layer contains a carbon nanotube, and the gate insulating layer contains a polymer having inorganic particles bound thereto. Provided is a field-effect transistor and a method for producing the field-effect transistor, wherein the field-effect transistor causes decreased leak current and furthermore enables a semiconductor solution to be uniformly applied.

14 Claims, 2 Drawing Sheets

FIELD EFFECT-TRANSISTOR, METHOD FOR MANUFACTURING SAME, WIRELESS COMMUNICATION DEVICE USING SAME, AND PRODUCT TAG

TECHNICAL FIELD

The present invention relates to a field-effect transistor, a method for manufacturing the same, as well as a wireless communication device and a goods tag including the same.

BACKGROUND ART

A field-effect transistor (FET) using carbon nanotubes (CNTs) in the semiconductor layer thereof has been extensively investigated in recent years. CNTs are soluble in an organic solvent, so that a semiconductor layer can be formed through low cost formation of a thin film by means of an application method such as an inkjet printing. In this case, in order for the obtained FET to have stable electric characteristics, a smoothly and uniformly coated semiconductor layer needs to be formed.

In addition, an important member of the FET is a gate insulating layer. A gate insulating layer is a member that separates a semiconductor layer from a gate electrode, and the electric characteristics of an insulating layer used significantly affects important performance characteristics of an FET, such as a leak current value. It is usual that a semiconductor layer is formed in contact with a gate insulating layer. In the semiconductor layer, a channel through which an electric current runs is formed near the interface with the gate insulating layer. Accordingly, the surface property of the gate insulating layer can significantly affect the FET characteristics.

An organic material such as an organic polymer that is soluble in an organic solvent is also being under an active study as the material for the gate insulating layer. With this material, a thin film can be formed by an inexpensive application method such as a slit coating method; and in addition, this can be formed onto a flexible substrate by a low temperature process. Furthermore, a study is being made on adding an inorganic compound to an insulating layer to control the electric characteristics of the insulating layer.

Among application type materials that are soluble in an organic solvent and used for gate insulating layers, known examples of materials having an added inorganic compound include a gate insulating layer containing a polymer and inorganic oxide microparticles (see, for example, Patent Literature 1) and a gate insulating layer containing a polymer bound to nanoparticles having a polymerizable group (see, for example, Patent Literature 2). Patent Literature 1 discloses a semiconductor layer containing a CNT (CNT composite) having a conjugated polymer attached to at least part of the surface of the CNT and also discloses an FET having a gate insulating layer containing a polymer and inorganic oxide microparticles. Causing the semiconductor layer to contain a CNT composite affords an FET having high mobility and a high on/off ratio. There is also another report that the issues of high turn-on voltage and high hysteresis can significantly be improved by using a gate insulating layer containing a polymer and inorganic oxide microparticles. Patent Literature 2 indicates that a gate insulating layer containing polysiloxane bound to nanoparticles having a polymerizable group enables an FET to have higher mobility, a higher on/off ratio, and lower leak current.

CITATION LIST

Patent Literature

Patent Literature 1: Japanese Patent Application Laid-open No. 2013-115162
Patent Literature 2: U.S. Patent Application No. 2016/0347969

SUMMARY OF INVENTION

Technical Problem

The technology in Patent Literature 1 poses not only a problem in that a conductive path formed by part of aggregated inorganic particles causes large leak current but also a problem in that the semiconductor solution lacks uniform applicability and that the on-current value is insufficient. The technology in Patent Literature 2 poses a problem in that the on-current value is still insufficient. In addition, there is no mention of improvement in the applicability of the semiconductor solution.

In view of the above-mentioned, an object of the present invention is to provide a field-effect transistor and a method for producing the field-effect transistor, wherein the field-effect transistor causes lower leak current and furthermore enables a semiconductor solution to be uniformly applied.

Solution to Problem

A field-effect transistor according to the present invention includes at least: a substrate; a source electrode; a drain electrode; a gate electrode; a semiconductor layer in contact with the source electrode and with the drain electrode; and a gate insulating layer insulating between the semiconductor layer and the gate electrode, wherein the semiconductor layer contains a carbon nanotube, and wherein the gate insulating layer contains a polymer having inorganic particles bound thereto.

Advantageous Effects of Invention

The present invention makes it possible to obtain a field-effect transistor and a method for producing the field-effect transistor, wherein the field-effect transistor causes lower leak current and furthermore enables a semiconductor solution to be uniformly applied.

DESCRIPTION OF EMBODIMENTS

Figure 1:
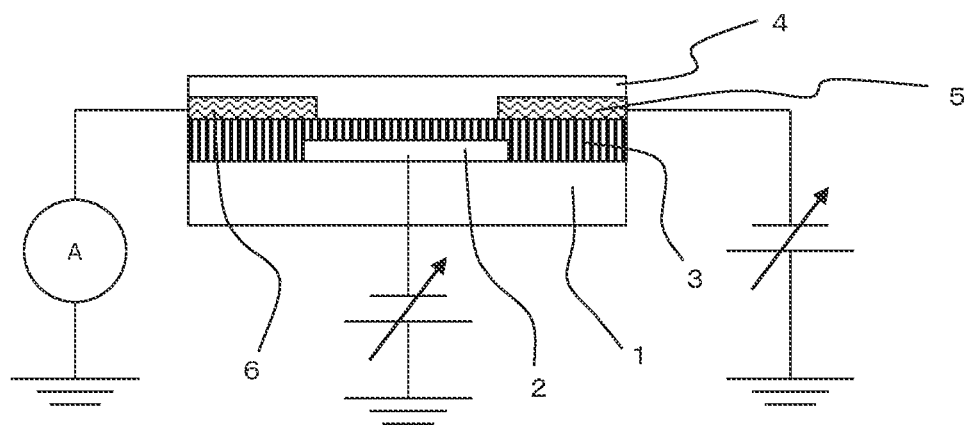
FIG. 1 is a schematic sectional view illustrating an example of the field-effect transistor according to the embodiment of the present invention.

Hereinafter, preferred embodiments of a field-effect transistor (FET), a method for manufacturing the same, as well as a wireless communication device and a goods tag using the same according to the present invention will be explained in detail. Note that the present invention is not limited to the following embodiments, and thus, the invention may be carried out with variously modifying the embodiments in accordance with the purpose and use thereof.

An FET according to the present invention includes at least: a substrate; a source electrode; a drain electrode; a gate electrode; a semiconductor layer in contact with the source electrode and with the drain electrode; and a gate insulating layer insulating between the semiconductor layer and the gate electrode, wherein the semiconductor layer contains a carbon nanotube (CNT), and wherein the gate insulating layer contains a polymer having inorganic particles bound thereto. Here, that the gate insulating layer insulates between the semiconductor layer and the gate electrode means that the gate insulating layer electrically separates the semiconductor layer from the gate electrode.

<Gate Insulating Layer>

(Polymer Having Inorganic Particles Bound Thereto)

A gate insulating layer in an FET according to the present invention contains a polymer having inorganic particles bound thereto. Here, the bond is selected from a covalent bond, ionic bond, coordinate bond, metallic bond, hydrogen bond, bond by π-π interaction, bond by ion-dipole interaction, bond by dipole-dipole interaction, bond by dipole-induced dipole interaction, bond by hydrophobic interaction, bond by charge-transfer complex formation, bond by metal-ligand complex formation, bond by London dispersion force, and bond by Van der Waals force. Among these, the covalent bond is preferable from the viewpoint of the chemical stability of the polymer having inorganic particles bound thereto and the stable operation of an FET.

Using a polymer having inorganic particles bound thereto enables the obtained FET to have larger on-current. This is presumed to be because using a polymer having inorganic particles bound thereto, compared with mixing inorganic particles and a polymer, suppresses the aggregation of the inorganic particles, causing the obtained gate insulating layer to be homogeneous, whereby the surface shape of the gate insulating layer is made optimal for formation of a CNT network serving as a conductive path in a semiconductor layer, when the semiconductor layer is applied and formed on the gate insulating layer. The above-mentioned effect cannot be obtained in cases where the material contained in the semiconductor layer is a nanocarbon material, such as fullerene, other than a CNT. In addition, the state where the inorganic particles are bound to a polymer enhances the alkali solubility of the inorganic particles, and thus, can suppress degradation of the patterning properties, wherein the degradation is caused by generation of a residue in using an alkali developing solution.

Whether a bond is present between inorganic particles and a polymer can be determined using a combination of analysis means such as $^{13}$C-NMR, $^{29}$Si-NMR, and IR. For example, $^{13}$C-NMR or $^{29}$Si-NMR is used to compare a spectrum of inorganic particles, a spectrum of a polymer, and a spectrum of a polymer having inorganic particles bound thereto. Whether a bond is present between inorganic particles and a polymer can be determined because a peak derived from a C or Si atom bound to the inorganic particle in the polymer having the inorganic particles bound thereto is a peak having a chemical shift that is not in a spectrum of a polymer.

Similarly in the case of IR, whether a bond is present between inorganic particles and a polymer can be determined because a peak derived from a C or Si atom in the polymer having the inorganic particles bound thereto is a peak the wavenumber of which is different from that of a spectrum of a polymer.

The inorganic particle is not restricted to any particular one as long as the inorganic particle is composed of an inorganic substance, and is preferably a particle composed of a metal compound or a semimetal compound. The inorganic particles have a small shrinkage rate in heat curing, and thus, enable generation of shrinkage stress to be suppressed. Thus, the inorganic particles enable the gate insulating layer to have higher crack resistance and lower leak current. Here, the leak current is a current that is leaked out into an unintended part in a circuit. In order to drive an FET with a low power consumption, the leak current needs to be small. The leak current value is preferably 50 pA or lower, more preferably 35 pA or lower, still more preferably 20 pA or lower, particularly preferably 10 pA or lower.

Examples of metals or semimetals include an element selected from the group consisting of silicon, magnesium, calcium, strontium, barium, lanthanum, cerium, tin, titanium, zirconium, hafnium, yttrium, niobium, tantalum, and aluminum. Examples of metal compounds or semimetal compounds include halides, oxides, nitrides, hydroxides, carbonate salts, sulfate salts, nitrate salts, and metasilicate salts of the above-mentioned metals or semimetals. Among these, metal oxides are preferable from the viewpoint of enhancing the on-current of an FET.

The inorganic particle is not restricted to any particular shape but preferably has a shape having a low aspect ratio, more preferably a spherical shape, to keep the surface of the gate insulating layer smooth.

The number-average particle size of the inorganic particles is preferably 1 nm or more, more preferably 5 nm or more, still more preferably 15 nm or more, particularly preferably 20 nm or more, from the viewpoint of decreasing a leak current through enhancing the patterning properties and crack resistance of the gate insulating layer. The inorganic particles having a number-average particle size in these ranges make it possible that the crack resistance of the gate insulating layer is enhanced, and that the leak current is decreased. On the other hand, the number-average particle size is preferably 100 nm or lower, more preferably 70 nm or lower, still more preferably 60 nm or lower, particularly preferably 50 nm or lower. The inorganic particles having a number-average particle size in these ranges make it possible that the patterning properties are enhanced.

Here, the number-average particle size of inorganic particles can be determined by using a scanning electron microscope (SEM) or a transmission electron microscope (TEM) to make a measurement in the following manner. The cross section of a gate insulating layer is observed at a magnification ratio of 50,000× to 200,000×. In cases where the inorganic particle is spherical, the diameter of the spherical particle is measured and regarded as the particle size of the particle. In cases where the inorganic particle is not spherical, the longest diameter (hereinafter "long axis diameter") and the diameter (hereinafter "short axis diameter") longest in the direction perpendicular to the long axis diameter are measured, and a two-axis average diameter obtained by averaging the long axis diameter and the short axis diameter is regarded as the particle size of the particle. This particle size measurement is made on randomly selected 20 or more particles, and the arithmetic average of the measurements is regarded as the number-average particle size.

To react with a matrix resin easily, the surface of the inorganic particle preferably has a functional group capable of reacting with a resin, such as a hydroxy group. Good reactivity between inorganic particles and a matrix resin allows the inorganic particles to be incorporated in the resin in heat curing, and suppresses generation of shrinkage stress in heat curing, thus causing the gate insulating layer to have higher crack resistance and lower leak current.

Examples of inorganic particles include silica particles, magnesium fluoride particles, magnesium chloride particles, magnesium bromide particles, magnesium oxide particles, magnesium carbonate particles, magnesium sulfate particles, magnesium nitrate particles, magnesium hydroxide particles, calcium fluoride particles, calcium chloride particles, calcium bromide particles, calcium oxide particles, calcium carbonate particles, calcium sulfate particles, calcium nitrate particles, calcium hydroxide particles, strontium fluoride particles, barium fluoride particles, lanthanum fluoride particles, cerous fluoride, tin oxide-titanium oxide composite particles, silicon oxide-titanium oxide composite particles, titanium oxide particles, zirconium oxide particles, hafnium oxide, tin oxide particles, yttrium oxide particles, niobium oxide particles, tantalum oxide particles, tin oxide-zirconium oxide composite particles, silicon oxide-zirconium oxide composite particles, aluminum oxide particles, barium titanate particles, strontium titanate particles, barium titanate-strontium titanate composite particles, and the like. From the viewpoint of compatibility with the below-mentioned polymers, a preferable inorganic particle is selected form silica particles, tin oxide-titanium oxide composite particles, silicon oxide-titanium oxide composite particles, titanium oxide particles, zirconium oxide particles, hafnium oxide, tin oxide particles, yttrium oxide particles, niobium oxide particles, tantalum oxide particles, tin oxide-zirconium oxide composite particles, silicon oxide-zirconium oxide composite particles, aluminum oxide particles, barium titanate particles, strontium titanate particles, and barium titanate-strontium titanate composite particles.

From the viewpoint of enhancing the on-current of an FET, a more preferable inorganic particle is selected form tin oxide-titanium oxide composite particles, silicon oxide-titanium oxide composite particles, titanium oxide particles, zirconium oxide particles, hafnium oxide, yttrium oxide particles, niobium oxide particles, tantalum oxide particles, tin oxide-zirconium oxide composite particles, silicon oxide-zirconium oxide composite particles, aluminum oxide particles, barium titanate particles, strontium titanate particles, and barium titanate-strontium titanate composite particles.

The on-current is an electric current flowing in a circuit during the time while an FET is driven at a gate voltage value (during ON), and the on-current needs to be increased to enhance the switching characteristics of the FET. The on-current value is preferably 5 µA or more, more preferably 20 µA or more, still more preferably 50 µA or more, particularly preferably 100 µA or more.

From the viewpoint of the property of patterning with an alkali developing solution, preferable examples of silica particles include methanol silica sol having methanol (MA) as a dispersion medium, IPA-ST having isopropyl alcohol (IPA) as a dispersion medium, EG-ST having ethylene glycol (EG) as a dispersion medium, MEK-ST having methylethyl ketone (MEK) as a dispersion medium, PMA-ST having propylene glycol monomethyl ether acetate (PG-MEA) as a dispersion medium, PGM-ST having propylene glycol monomethyl ether (PGME) as a dispersion medium, SNOWTEX (registered trademark) OXS having water as a dispersion solution, SNOWTEX (registered trademark) OS having water as a dispersion solution, SNOWTEX (registered trademark) O having water as a dispersion solution, SNOWTEX (registered trademark) O-50 having water as a dispersion solution (which are manufactured by Nissan Chemical Corporation), OSCAL (registered trademark)-1421 having IPA as a dispersion medium, OSCAL (registered trademark)-1432 having IPA as a dispersion medium, OSCAL (registered trademark)-1132 having MA as a dispersion medium, OSCAL (registered trademark)-1632 having ethylene glycol monomethyl ether (EGME) as a dispersion medium, OSCAL (registered trademark)-1727BM having EG as a dispersion medium (which are manufactured by JGC Catalysts & Chemicals Ltd.), Quartron (registered trademark) PL-06L having water as a dispersion solution, Quartron (registered trademark) PL-1 having water as a dispersion solution, Quartron (registered trademark) PL-2L having water as a dispersion solution, Quartron (registered trademark) PL-3 having water as a dispersion solution, Quartron (registered trademark) PL-1-IPA having IPA as a dispersion medium, Quartron (registered trademark) PL-2L-IPA having IPA as a dispersion medium, Quartron (registered trademark) PL-2L-MA having MA as a dispersion medium, Quartron (registered trademark) PL-2L-PGME having PGME as a dispersion medium, and Quartron (registered trademark) PL-2L-DAA having diacetone alcohol (DAA) as a dispersion medium (which are manufactured by Fuso Chemical Co., Ltd.). Other known materials can also be used.

Examples of tin oxide-titanium oxide composite particles include OPTOLAKE (registered trademark) TR-502 or TR-504 (which are both manufactured by JGC Catalysts & Chemicals Ltd.).

Examples of silicon oxide-titanium oxide composite particles include OPTOLAKE (registered trademark) TR-503, TR-513, TR-520, TR-521, TR-527, TR-528, TR-529, TR-543, TR-544, or TR-550 (which are all manufactured by JGC Catalysts & Chemicals Ltd.).

Examples of titanium oxide particles include OPTOLAKE (registered trademark) TR-505 (manufactured by JGC Catalysts & Chemicals Ltd.), TINOC (registered trademark) A-6, M-6, or AM-15 (which are all manufactured by Taki Chemical Co., Ltd.), nSol (registered trademark) 101-20I, 101-20L, 101-20BL, or 107-20I (which are all manufactured by NanoGram Corporation), TTO-51(A), TTO-51 (B), TTO-55(A), TTO-55(B), TTO-55(C), TTO-55(D), TTO-V-4, or TTO-W-5 (which are all manufactured by Ishihara Sangyo Kaisha Ltd.), RTTAP15WT %-E10, RTTDNB15WT %-E11, RTTDNB15WT %-E12, RTTDNB15WT %-E13, RTTIBA15WT %-E6, RTIPA15WT %-NO8, RTIPA15WT %-NO9, RTIPA20WT %-N11, RTIPA20WT %-N13, RTIPA20WT %-N14, or RTIPA20WT %-N16 (which are all manufactured by C. I. Kasei Co., Ltd.), or HT331B, HT431B, HT631B, HT731B, or HT830X (which are all manufactured by Toho Titanium Co., Ltd.).

Examples of zirconium oxide particles include NanoUse (registered trademark) ZR-30BL, ZR-30BS, ZR-30BH, ZR-30AL, ZR-30AH, or OZ-30M (which are all manufactured by Nissan Chemical Corporation), or ZSL-M20, ZSL-10T, ZSL-10A, or ZSL-20N (manufactured by Daiichi Kigenso Kagaku Kogyo Co., Ltd.).

Examples of tin oxide particles include Ceramace (registered trademark) S-8 or S-10 (which are both manufactured by Taki Chemical Co., Ltd.).

Examples of niobium oxide particles include Biral (registered trademark) Nb-X10 (manufactured by Taki Chemical Co., Ltd.).

Examples of other inorganic particles include tin oxide-zirconium oxide composite particles (manufactured by Catalysts & Chemicals Industries Co., Ltd.), tin oxide particles or zirconium oxide particles (which are both manufactured by Kojundo Chemical Laboratory Co., Ltd.).

The inorganic particle content of the gate insulating layer is preferably 10 vol % or more, more preferably 15 vol % or more, particularly preferably 20 vol % or more, in terms of volume fraction. Similarly, the content is preferably 60 vol % or less, more preferably 50 vol % or less, particularly preferably 40 vol % or less. The inorganic particle content in these ranges makes it possible that the crack resistance is enhanced without impairing the property of patterning at the gate insulating layer, and thus that the leak current is decreased.

A polymer having inorganic particles bound thereto is preferably soluble in a solvent. A polymer to be used has any one of a straight-chain backbone, a cyclic backbone, and a branched backbone. In addition, the side chain preferably has an incorporated cross-linkable functional group, polar functional group, or functional group that controls various characteristics of the polymer. Using a polymer having these controlled characteristics affords, for example, applicability, surface flatness, solvent resistance, transparency, good ink wettability, and the like in a step of producing an FET device. Furthermore, a good FET device can be obtained, exhibiting excellent durability and stability after the FET device is formed.

A polymer used in the present invention is not restricted to any particular one as long as the polymer exhibits insulating performance enough for an FET to function normally, and examples of such polymers to be used include polysiloxane, polyamide, polyamideimide, polyimide, polybenzimidazole, polyvinyl alcohol, polyvinylphenol, polyacetal, polycarbonate, polyalylate, polyphenylene sulfide, polyether sulfone, polyetherketone, polyphthalamide, polyethernitrile, polymethylmethacrylate, polymethacrylamide, polyvinylidene fluoride, polytetrafluoroethylene, polystyrene, polyester, aromatic polyether, novolac resin, phenol resin, acryl resin, olefin resin, alicyclic olefin resin, vinyl chloride resin, epoxy resin, melamine resin, urea resin, and the like. In addition, any of these polymers may be copolymerized or mixed with another polymer and used. Among these, polysiloxane is preferably used from the viewpoint of allowing an FET to have higher on-current and lower leak current.

The polysiloxane preferably has a structural unit represented by the general formula (1).

[Chem. 1]

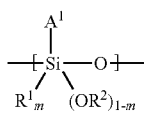

(1)

In the general formula (1), $R^1$ represents a hydrogen atom, an alkyl group, a cycloalkyl group, a heterocyclic group, an aryl group, a heteroaryl group, or an alkenyl group. $R^2$ represents a hydrogen atom, an alkyl group, a cycloalkyl group, or a silyl group. m represents 0 or 1. $A^1$ represents an organic group including at least two groups selected from a carboxyl group, a sulfo group, a thiol group, a phenolic hydroxy group, or a derivative of these groups. Here, when the derivative is a cyclic condensed structure formed by two of the carboxyl group, the sulfo group, the thiol group, and the phenolic hydroxy group, $A^1$ represents an organic group having at least one the cyclic condensed structure.

Illustrative examples of the alkyl group include saturated aliphatic hydrocarbon groups such as a methyl group, an ethyl group, an n-propyl group, an isopropyl group, an n-butyl group, a sec-butyl group, and a tert-butyl group, in which these groups may or do not necessarily include a substituent group. The substituent group is not particularly restricted, in which illustrated examples thereof include an alkoxy group, an aryl group, and a heteroaryl group. These groups may further have a substituent group. In addition, the number of carbon atoms in an alkyl group is not limited to a particular one, but is preferably at least 1 and up to 20, more preferably at least 1 and up to 8, from the viewpoints of easy availability and cost.

Illustrative examples of the cycloalkyl group include saturated alicyclic hydrocarbon groups such as a cyclopropyl group, a cyclohexyl group, a norbornyl group, and an adamantly group, in which these groups may or do not necessarily include a substituent group. The substituent group is not particularly restricted, in which illustrated examples thereof include an alkyl group, an alkoxy group, an aryl group, and a heteroaryl group. These groups may further have a substituent group. Explanation with regard to these substituent groups is common in the description hereinafter. The carbon number of the cycloalkyl group is not particularly restricted, but preferably at least 3 and up to 20.

The heterocyclic group is the group derived from an aliphatic ring having inside the ring thereof an atom other than a carbon atom, such as a pyran ring, a piperidine ring, and an amide ring, in which these groups may or do not necessarily include a substituent group. The carbon number of the heterocyclic group is not particularly restricted, but preferably at least 2 and up to 20.

The aryl group is an aromatic hydrocarbon group, such as a phenyl group, a naphthyl group, a biphenyl group, an anthracenyl group, a phenanthryl group, a terphenyl group, and a pyrenyl group, in which these groups may or do not necessarily include a substituent group. The carbon number of the aryl group is not particularly restricted, but preferably in the range of 6 to 40.

The heteroaryl group is an aromatic group including inside the ring thereof one or plural atoms other than a carbon atom, such as a furanyl group, a thiophenyl group, a benzofuranyl group, a dibenzofuranyl group, a pyridyl group, and a quinolinyl group, in which these groups may or do not necessarily include a substituent group. The carbon number of the heteroaryl group is not particularly restricted, but preferably in the range of 2 to 30.

The alkenyl group is an unsaturated aliphatic hydrocarbon group including a double bond, such as a vinyl group, an allyl group, and a butadienyl group, in which these groups may or do not necessarily include a substituent group. The carbon number of the alkenyl group is not particularly restricted, but preferably in the range of at least 2 and up to 20.

The alkoxy group cited as the substituent group is a functional group having one of ether bonds thereof substituted with an aliphatic hydrocarbon group, such as a methoxy group, an ethoxy group, or a propoxy group, in which these aliphatic hydrocarbon groups may or do not necessarily include a substituent group. The carbon number of the alkoxy group is not particularly restricted, but preferably in the range of at least 1 and up to 20.

In $A^1$, the organic group represents an alkyl group, a cycloalkyl group, a heterocyclic group, an aryl group, a heteroaryl group, or an alkenyl group, which have been mentioned already. Among these, in view of a low hysteresis, an alkyl group, a cycloalkyl group, an aryl group, and an alkenyl group are preferable; an alkyl group and an aryl group are more preferable, while an alkyl group is still more preferable.

When the polysiloxane having the structural unit represented by the general formula (1) includes as $A^1$ an organic group having at least two groups selected from a carboxyl group, a sulfo group, a thiol group, a phenolic hydroxy group, or a derivative of these groups, a semiconductor layer in which the obtained gate insulating layer is coated with CNTs smoothly and uniformly can be formed. It is presumed that this can occur because these polar functional groups present on the surface of the insulating layer control the wettability of the semiconductor solution thereby enabling an application without repulsion.

In the case where the derivative is a cyclic condensed structure formed by two groups out of the carboxyl group, the sulfo group, the thiol group, and the phenolic hydroxy group, when $A^1$ includes an organic group having at least one cyclic condensed structure thereof, the same effects can be obtained.

The applicability of the semiconductor solution onto the gate insulating layer can be evaluated by measuring the contact angle of the semiconductor solution to the gate insulating layer by means of a sessile drop method. In view of uniform application without repulsion, the contact angle is preferably lower than 15°, more preferably lower than 12°, still more preferably lower than 10°, particularly preferably lower than 9°. On the other hand, because a certain film thickness is needed in order to have a stable operation in FET, the contact angle is preferably 4° or higher, more preferably 5° or higher, still more preferably 6° or higher, particularly preferably 7° or higher.

When the polysiloxane having the structural unit represented by the general formula (1) has $A^1$, the obtained gate insulating layer results in having higher crack resistance and lower leak current.

When the polysiloxane having the structural unit represented by the general formula (1) has $A^1$, an excellent solubility to an alkali developing solution during lithography of the gate insulating layer can be realized. With this, patterning can be performed highly precisely in accordance with the designed size thereby realizing a high resolution. The resolution is preferably 30 μm or lower, more preferably 15 μm or lower, while still more preferably 5 μm or lower.

Among the derivatives of the carboxyl group, the sulfo group, the thiol group, and the phenolic hydroxy group, illustrative examples of the non-cyclic condensed structure include a carboxylate ester, a sulfonate ester, a thioester, a thioether, and a phenyl ether with a hydrocarbon group or with a silyl group. Additional examples include a carboxylic acid anhydride and an amide compound or an imide compound formed by reaction of a carboxylic acid anhydride with an amine compound.

As the silyl group, there is no particular restriction so far as it is a functional group having a bonding point of a Si atom. The silyl group may have a hydrogen group, an organic group, and further a silyl group; or it may be formed via an oxygen atom. A polysiloxane may also be possible.

Illustrative examples of the cyclic condensed structure formed two groups selected from the carboxyl group, the sulfo group, the thiol group, and the phenolic hydroxy group include a cyclic acid anhydride structure, a cyclic ester structure, a cyclic thioester structure, a cyclic ether structure, and a cyclic thioether structure.

The condensation encompasses both intramolecular condensation and intermolecular condensation. Intermolecular condensation encompasses both those formed among the polysiloxanes themselves and those derived from other constituent materials.

In view of improvement in the applicability of the semiconductor solution and a decrease in leak current by enhanced crack resistance of the gate insulating layer, $A^1$ in the general formula (1) is preferably an organic group having at least two carboxyl groups or derivatives thereof or at least one cyclic acid anhydride group. $A^1$ is more preferably the group represented by the following general formula (2) or (3).

[Chem. 2]

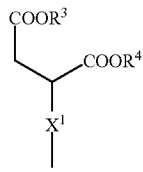

(2)

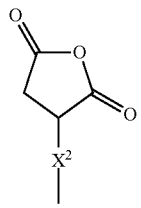

(3)

In the general formula (2), $X^1$ represents a single bond, an alkylene group having 1 to 10 carbon atoms, or an arylene group having 6 to 15 carbon atoms; $R^3$ and $R^4$ represent independently a hydrogen atom, an organic group, or a silyl group; in the general formula (3), $X^2$ represents a single bond, an alkylene group having 1 to 10 carbon atoms, or an arylene group having 6 to 15 carbon atoms.

In the polysiloxane, in view of improvement in the applicability of the semiconductor solution, a decrease in leak current by enhanced crack resistance of the gate insulating layer, and improvement in the resolution during lithography of the gate insulating layer, the content ratio of the structural unit represented by the general formula (1) that occupies in the entire silane structural units is preferably 0.5 mol % or higher, more preferably 1.0 mol % or higher, while still more preferably 1.5 mol % or higher. In view of avoiding an increase in the leak current due to moisture absorption, the content ratio is preferably 25 mol % or lower, more preferably 20 mol % or lower, while still more preferably 15 mol % or lower.

In the polysiloxane, the content ratio of the structural unit represented by the general formula (1) that occupies in the entire silane structural units can be obtained from $^{13}$C-NMR. In the carboxyl group and the derivatives thereof, the carbon atom of the carbonyl group appears characteristically in the chemical shift region of about 170 ppm to 180 ppm; in the sulfo group and the derivatives thereof, the carbon atom bonded to the S atom appears characteristically in the chemical shift region of about 30 ppm to 40 ppm; in the thiol group and the derivatives thereof, the carbon atom bonded to the S atom appears characteristically in the chemical shift region of about 10 ppm to 20 ppm; and in the phenolic hydroxy group and the derivatives thereof, the carbon atom, which is in the aromatic ring and bonded to the O atom derived from the phenolic hydroxide, appears characteristically in the chemical shift region of about 140 ppm to 170 ppm. From the peak area ratio of these peaks to the peaks of the carbon atoms in other structural units, the content ratio of the structural unit can be obtained.

Examples of structural units represented by the general formula (1) include the following structural units derived from silane compounds.

The structural units having the carboxyl group or the derivative thereof are: dimethoxymethylsilylmethylsuccinic acid, diethoxymethylsilylmethylsuccinic acid, dimethoxyphenylsilylmethylsuccinic acid, diethoxyphenylsilylmethylsuccinic acid, trimethoxysilylmethylsuccinic acid, triethoxysilylmethylsuccinic acid, 2-dimethoxymethylsilylethylsuccinic acid, 2-diethoxymethylsilylethylsuccinic acid, 2-dimethoxyphenylsilylethylsuccinic acid, 2-diethoxyphenylsilylethylsuccinic acid, 2-trimethoxysilylethylsuccinic acid, 2-triethoxysilylethylsuccinic acid, 3-dimethoxymethylsilylpropylsuccinic acid, 3-diethoxymethylsilylpropylsuccinic acid, 3-dimethoxyphenylsilylpropylsuccinic acid, 3-diethoxyphenylsilylpropylsuccinic acid, 3-trimethoxysilylpropylsuccinic acid, 3-triethoxysilylpropylsuccinic acid, 4-dimethoxymethylsilylbutylsuccinic acid, 4-diethoxymethylsilylbutylsuccinic acid, 4-dimethoxyphenylsilylbutylsuccinic acid, 4-diethoxyphenylsilylbutylsuccinic acid, 4-trimethoxysilylbutylsuccinic acid, 4-triethoxysilylbutylsuccinic acid, 5-dimethoxymethylsilylpentylsuccinic acid, 5-diethoxymethylsilylpentylsuccinic acid, 5-dimethoxyphenylsilylpentylsuccinic acid, 5-diethoxyphenylsilylpentylsuccinic acid, 5-trimethoxysilylpentylsuccinic acid, 5-triethoxysilylpentylsuccinic acid, 6-dimethoxymethylsilylhexylsuccinic acid, 6-diethoxymethylsilylhexylsuccinic acid, 6-dimethoxyphenylsilylhexylsuccinic acid, 6-diethoxyphenylsilylhexylsuccinic acid, 6-trimethoxysilylhexylsuccinic acid, 6-triethoxysilylhexylsuccinic acid, anhydrides of compounds having any of these succinic acid structures, and structural units derived from compounds having gluconic acid in place of these succinic acids.

The structural units having the sulfo group or the derivative thereof are: 5-dimethoxymethylsilylpentane-1,2-disulfonic acid, 5-diethoxymethylsilylpentane-1,2-disulfonic acid, 5-dimethoxyphenylsilylpentane-1,2-disulfonic acid, 5-diethoxyphenylsilylpentane-1,2-disulfonic acid, 5-trimethoxysilylpentane-1,2-disulfonic acid, 5-triethoxysilylpentane-1,2-disulfonic acid, as well as the structural units derived from methyl esters, ethyl esters, n-propyl esters, isopropyl esters, n-butyl esters, sec-butyl esters, and t-butyl esters of the above-mentioned structural units.

The structural units having the thiol group or the derivative thereof are: 3-(3-dimethoxymethylsilyl]propyloxy)propane-1,2-dithiol, 3-(3-diethoxymethylsilylpropyloxy)propane-1,2-dithiol, 3-(3-dimethoxyphenylsilyl]propyloxy) propane-1,2-dithiol, 3-(3-diethoxyphenylsilyl]propyloxy) propane-1,2-dithiol, 3-(3-trimethoxysilylpropyloxy) propane-1,2-dithiol, 3-(3-triethoxysilylpropyloxy)propane-1,2-dithiol, as well as the structural units derived from methyl thioethers, ethyl thioethers, n-propyl thioethers, isopropyl thioethers, n-butyl thioethers, sec-butyl thioethers, and t-butyl thioethers of the above-mentioned structural units.

The structural units having the phenolic hydroxy group or the derivative thereof are: a catechol, a resorcinol, a hydroquinone, or a fluoroglucinol, these having a 3-dimethoxymethylsilylpropyl group, a 3-diethoxymethylsilylpropyl group, a 3-dimethoxyphenylsilylpropyl group, a 3-diethoxyphenylsilylpropyl group, a 3-trimethoxysilylpropyl group, or a 3-triethoxysilylpropyl group, as well as the structural units derived from methyl ethers, ethyl ethers, n-propyl ethers, isopropyl ethers, n-butyl ethers, sec-butyl ethers, and t-butyl ethers of the above-mentioned structural units.

The structural units having a pair of different groups selected from the carboxyl group, the sulfo group, the thiol group, the phenolic hydroxy group, and the derivatives thereof are: 1-carboxyl-2-sulfo-5-trimethoxysilylpentane, 1-carboxyl-2-mercapto-5-trimethoxysilylpentane, 1-sulfo-2-mercapto-5-trimethoxysilylpentane, 1-carboxyl-2-hydroxy-4-trimethoxysilylbenzene, 1-sulfo-2-hydroxy-4-trimethoxysilylbenzene, 1-mercapto-2-hydroxy-4-trimethoxysilylbenzene, as well as positional isomers of these structural units whose substituent groups are in different positions, and in addition, the structural units derived from methyl (thio)esters, ethyl (thio)esters, n-propyl (thio) esters, isopropyl (thio)esters, n-butyl (thio)esters, sec-butyl (thio)esters, t-butyl (thio)esters, methyl (thio)ethers, ethyl (thio)ethers, n-propyl (thio)ethers, isopropyl (thio)ethers, n-butyl (thio)ethers, sec-butyl (thio)ethers, t-butyl (thio) ethers, cyclic (thio)esters, and cyclic (thio)ethers.

Among these structural units, in view of improvement in applicability of the semiconductor solution and leak current decreased by enhanced crack resistance of the gate insulating layer, the structural units derived from the silane compounds having at least two carboxyl groups or derivatives thereof, or at least one cyclic acid anhydride group are preferable; the structural units derived from the silane compounds having the succinic acid, the succinic acid anhydride structure, or the derivative thereof are more preferable; and the structural units derived from the silane compounds having the succinic acid or the succinic acid anhydride structure are still more preferable. Specifically, 3-dimethoxymethylsilylpropylsuccinic aid, 3-diethoxymethylsilylpropylsuccinic acid, 3-dimethoxyphenylsilylpropylsuccinic acid, 3-diethoxyphenylsilylpropylsuccinic acid, 3-trimethoxysilylpropylsuccinic acid, 3-triethoxysilylpropylsuccinic acid, as well as the structural units derived from anhydrides of these acids are even more preferable; and 3-trimethoxysilylpropylsuccinic acid, 3-triethoxysilylpropylsuccinic acid, as well as the structural units derived from anhydrides of these acids are particularly preferable.

In the present invention, in view of improvement in the crack resistance and a decrease in leak current which are to be achieved by introduction of a crosslinking structure, it is preferable that the polysiloxane in the gate insulating layer further has a structural unit represented by the general formula (4).

[Chem. 3]

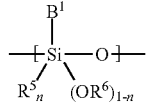

(4)

In the general formula (4), $R^5$ represents a hydrogen atom, an alkyl group, a cycloalkyl group, a heterocyclic group, an aryl group, a heteroaryl group, or an alkenyl group. $R^6$ represents a hydrogen atom, an alkyl group, a cycloalkyl group, or a silyl group. n represents 0 or 1; $B^1$ represents an organic group including an addition reaction structure formed among an acryl group and/or a methacryl group.

The organic groups including an addition reaction structure formed among an acryl group and/or a methacryl group are formed by addition reaction of the acryl groups and/or the methacryl groups included in the silane compounds having the acryl group and/or the methacryl group with each other and/or with the acryl group and/or the methacryl group included in a radical polymerizable compound to be described later. The addition reaction is a crosslinking reaction due to a radical polymerization by means of light or heat.

In the above-mentioned polysiloxane, the content ratio of the structural unit represented by the general formula (4) that occupies in the entire silane structural units is, in view of improvement in the crack resistance, preferably 5 mol % or higher, more preferably 15 mol % or higher, while still more preferably 25 mol % or higher. When the density of crosslinking is too high, the film is swelled during a wet process such as development in the photolithography process thereby causing a decrease in the resolution of a pattern. In view of avoiding this, the content ratio thereof is preferably 50 mol % or lower, more preferably 45 mol % or lower, while still more preferably 40 mol % or lower.

Examples of structural units represented by the general formula (4) include the following structural units derived from silane compounds. In view of reactivity of the addition reaction, preferable examples include the structural units obtained by the addition reaction of the structure derived from 3-acryloxypropyl dimethoxy methyl silane, 3-methacryloxypropyl dimethoxy methyl silane, 3-acryloxypropyl diethoxy methyl silane, 3-methacryloxypropyl diethoxy methyl silane, 3-acryloxypropyl dimethoxy phenyl silane, 3-methacryloxypropyl dimethoxy phenyl silane, 3-acryloxypropyl diethoxy phenyl silane, 3-methacryloxypropyl diethoxy phenyl silane, 3-acryloxypropyl trimethoxy silane, 3-methacryloxypropyl trimethoxy silane, 3-acryloxypropyl triethoxy silane, and 3-methacryloxypropyl triethoxy silane; and more preferable are the structural units obtained by the addition reaction of the structure derived from 3-acryloxypropyl trimethoxy silane, 3-methacryloxypropyl trimethoxy silane, 3-acryloxypropyl triethoxy silane, and 3-methacryloxypropyl triethoxy silane. In addition, other known materials can be used.

In the present invention, furthermore, in view of compatibility of both the high insulating performance and the high crack resistance, it is preferable that the polysiloxane in the gate insulating layer includes one or more structural unit other than the general formulae (1) and (4). Here, the insulating performance used in the present invention is an index of difficulty in the flow of electricity and refers to having a volume resistivity of $10^8$ Ω·cm or higher.

Examples of structural units other than represented by the general formulae (1) and (4) include structural units derived from the following silane compounds: vinyl trimethoxy silane, vinyl triethoxy silane, methyl trimethoxy silane, methyl triethoxy silane, ethyl trimethoxy silane, ethyl triethoxy silane, propyl trimethoxy silane, propyl triethoxy silane, hexyl trimethoxy silane, octadecyl trimethoxy silane, octadecyl triethoxy silane, phenyl trimethoxy silane, phenyl triethoxy silane, p-tolyl trimethoxy silane, benzyl trimethoxy silane, α-naphthyl trimethoxy silane, β-naphthyl trimethoxy silane, 3-aminopropyl triethoxy silane, N-(2-aminoethyl)-3-aminopropyl trimethoxy silane, 3-chloropropyl trimethoxy silane, dimethyl dimethoxy silane, dimethyl diethoxy silane, diphenyl dimethoxy silane, diphenyl diethoxy silane, methylphenyl dimethoxy silane, methylvinyl dimethoxy silane, methylvinyl diethoxy silane, 3-aminopropylmethyl dimethoxy silane, N-(2-aminoethyl)-3-aminopropylmethyl dimethoxy silane, 3-chloropropylmethyl dimethoxy silane, 3-chloropropylmethyl diethoxy silane, cyclohexylmethyl dimethoxy silane, 3-methacryloxypropyl dimethoxy silane, octadecylmethyl dimethoxy silane, trimethoxy silane, tetramethoxy silane, tetraethoxy silane, trifluoroethyl trimethoxy silane, trifluoroethyl triethoxy silane, trifluoroethyl triisopropoxy silane, trifluoropropyl trimethoxy silane, trifluoropropyl triethoxy silane, trifluoropropyl triisopropoxy silane, heptadecafluorodecyl trimethoxy silane, heptadecafluorodecyl triethoxy silane, heptadecafluorodecyl triisopropoxy silane, tridecafluorooctyl triethoxy silane, tridecafluorooctyl trimethoxy silane, tridecafluorooctyl triisopropoxy silane, trifluoroethylmethyl dimethoxy silane, trifluoroethylmethyl diethoxy silane, trifluoroethylmethyl diisopropoxy silane, trifluoropropylmethyl dimethoxy silane, trifluoropropylmethyl diethoxy silane, trifluoropropyl methyl diisopropoxy silane, heptadecafluorodecylmethyl dimethoxy silane, heptadecafluorodecylmethyl diethoxy silane, heptadecafluorodecyl methyl diisopropoxy silane, tridecafluorooctylmethyl dimethoxy silane, tridecafluorooctylmethyl diethoxy silane, tridecafluorooctyl methyl diisopropoxy silane, trifluoroethylethyl dimethoxy silane, trifluoroethyl ethyl diethoxy silane, trifluoroethyl ethyl diisopropoxy silane, trifluoropropyl ethyl dimethoxy silane, trifluoropropylethyl diethoxy silane, trifluoropropyl ethyl diisopropoxy silane, heptadecafluorodecyl ethyl dimethoxy silane, heptadecafluorodecyl ethyl diethoxy silane, heptadecafluorodecyl ethyl diisopropoxy silane, tridecafluorooctylethyl diethoxy silane, tridecafluorooctyl ethyl dimethoxy silane, tridecafluorooctyl ethyl diisopropoxy silane, and p-trifluorophenyl triethoxy silane.

(Method for Producing Polymer Having Inorganic Particles Bound Thereto)

The polymer having inorganic particles bound thereto and used in the present invention can be obtained, for example, by the following method. Here, polysiloxane is taken as an example. All the silane compounds and inorganic particles are fed into a solvent, and the resulting mixture is then stirred. To the resulting mixture, an acid catalyst and water are added over a period of 1 to 180 minutes, and then, a hydrolysis reaction is carried out at 15 to 80° C. for 1 to 180 minutes. The temperature at the time of the hydrolysis reaction is more preferably 15° C. to 55° C. The obtained reaction solution is further heated at a temperature equal to or higher than 50° C. and equal to or lower than the boiling point of the solvent for a period of 1 to 100 hours to carry out a condensation reaction, so that a polysiloxane having inorganic particles bound thereto can be obtained. As above-mentioned, one example is a method in which a silane compound is hydrolyzed for dehydration condensation in the presence of inorganic particles.

The conditions of the hydrolysis reaction, such as an acid concentration, the reaction temperature, and the reaction time, are set by considering, among other things, the scale of the reaction and the size and shape of the reactor in order to obtain the physical properties that match a target use.

Illustrative examples of the acid catalyst to be used in the hydrolysis reaction of the silane compound include formic acid, oxalic acid, hydrochloric acid, sulfuric acid, acetic acid, trifluoroacetic acid, phosphoric acid, polyphosphoric acid, a polyvalent carboxylic acid or an acid anhydride thereof, and an ion exchange resin. A content of the acid catalyst is preferably 0.05 part by mass or larger, and more preferably 0.1 part by mass or larger, relative to 100 parts by mass of the total silane compounds, i.e., the raw material of the polysiloxane. In addition, the acid catalyst content is preferably 10 parts by mass or smaller, and more preferably 5 parts by mass or smaller. When the content of the acid catalyst is 0.05 part by mass or larger, the hydrolysis reaction can advance sufficiently well; and when the content is 10 parts by mass or smaller, a rapid reaction can be suppressed.

The catalyst may be removed after hydrolysis reaction because the polysiloxane preferably contains none of the above-mentioned acid catalysts from the viewpoint of preservation stability. A preferable method of removing a catalyst is water washing or treatment with an ion exchange resin from the viewpoint of easy operation and removability. Here, water washing refers to a method in which a polysiloxane solution is diluted with a suitable hydrophobic solvent, and the resulting solution is washed with water several times, followed by concentrating the obtained organic layer using an evaporator or the like. The treatment with an ion exchange resin refers to a method in which the obtained polysiloxane solution is brought into contact with an ion exchange resin.

The solvent to be used in the hydrolysis reaction is preferably an organic solvent. Illustrative examples thereof include alcohols such as ethanol, propanol, butanol, and 3-methyl-3-methoxy-1-butanol; glycols such as ethylene glycol and propylene glycol; ethers such as ethylene glycol monomethyl ether, propylene glycol monomethyl ether, butylene glycol monobutyl ether, and diethyl ether; ketones such as methyl isobutyl ketone and diisobutyl ketone; amides such as dimethylformamide and dimethylacetamide; acetates such as ethyl acetate, ethyl cellosolve acetate, and 3-methyl-3-methoxy-1-butanol acetate; aromatic or aliphatic hydrocarbons such as toluene, xylene, hexane, and cyclohexane; and γ-butyrolactone, N-methyl-2-pyrrolidone, and dimethyl sulfoxide. The amount of the solvent is preferably at least 50 parts by mass and up to 500 parts by mass relative to 100 parts by mass of the total silane compounds, i.e., the raw material of the polysiloxane. When the amount thereof is 50 parts by mass or larger, a rapid reaction can be suppressed, and when the amount is 500 parts by mass or smaller, the hydrolysis reaction can advance sufficiently well.

As the water to be used in the hydrolysis reaction, ion-exchanged water is preferable. The amount of the water may be arbitrarily selected. When the silane compound having a hydrolysable structure such as an acid anhydride group or an epoxy group is used, in addition to an equimolar amount of water to the alkoxy group in the silane compound, it is suitable to further add the water equal to or larger than equimolar amounts to the functional groups to be hydrolyzed. In order to increase the degree of polymerization of the polysiloxane, re-heating or addition of a base catalyst may be carried out as well.

That the polysiloxane includes the structural unit represented by the general formula (1) and/or the general formula (4) can be determined by various organic analysis methods such as an elemental analysis, a nuclear magnetic resonance analysis, and an infrared spectroscopic analysis, singly or as a combination of a plurality of them.

The gate insulating layer according to the present invention may include one, or two or more of the polysiloxane. Alternatively, one or more of the polysiloxanes and one or more of the afore-mentioned silane compounds may be used as a mixture of them.

(Other Components)

The gate insulating layer in the present invention may further include an addition reactant of a radical polymerizable compound as a photosensitive organic component.

The radical polymerizable compound means a compound having plural ethylenic unsaturated double bond groups in its molecule. By irradiation with UV light, a radical polymerization of the radical polymerizable compound takes place by means of a radical that is generated from a photopolymerization initiator to be described later thereby leading to an increase in the crosslinking density of the gate insulating layer so that the hardness thereof can be enhanced.

The radical polymerizable compound is preferably a compound having a (meth)acryl group, which can readily undergo the radical polymerization. In view of enhancement of the sensitivity at the time of irradiation with UV light as well as enhancement of the hardness of the gate insulating layer, a compound having two or more of the (meth)acryl group in its molecule is more preferable.

In view of enhancement of the sensitivity at the time of irradiation with UV light and enhancement of the crack resistance of the cured film, preferable examples of radical polymerizable compounds include: trimethylolpropane tri(meth)acrylate, ditrimethylolpropane tetra(meth)acrylate, pentaerythritol tetra(meth)acrylate, dipentaerythritol penta(meth)acrylate, dipentaerythritol hexa(meth)acrylate, tripentaerythritol octa(meth)acrylate, 1,3,5-tris((meth)acryloxyethyl)isocyanuric acid, 9,9-bis[4-(2-(meth)acryloxyethoxy)phenyl]fluorene, as well as their acid-modified compounds, ethylene oxide-modified compounds, and propylene oxide-modified compounds.

The gate insulating layer in the present invention may further include, as the photosensitive organic component, a compound that can generate a radical by a bond breakage and/or a reaction when UV light is applied (hereinafter, this compound is referred to as a "photopolymerization initiator").

When the photopolymerization initiator is included therein, the radical polymerization of the radical polymerizable compound can take place, and the addition reaction at the time of irradiation with UV light can be facilitated.

Preferable examples of the photopolymerization initiator include a benzyl ketal photopolymerization initiator, an α-hydroxyketone photopolymerization initiator, an α-aminoketone photopolymerization initiator, an acylphosphine oxide photopolymerization initiator, an oxime ester photopolymerization initiator, an acridine photopolymerization initiator, a titanocene photopolymerization initiator, a benzophenone photopolymerization initiator, an acetophenone photopolymerization initiator, an aromatic ketoester photopolymerization initiator, and a benzoate ester photopolymerization initiator. In view of enhancement of the sensitivity at the time of irradiation with UV light, an α-hydroxyketone photopolymerization initiator, an α-aminoketone photopolymerization initiator, an acylphosphine oxide photopolymerization initiator, an oxime ester photopolymerization initiator, an acridine photopolymerization initiator, and a benzophenone photopolymerization initiator are more preferable, while an α-aminoketone photopolymerization initiator, an acylphosphine oxide photopolymerization initiator, and an oxime ester photopolymerization initiator are still more preferable.

Among specific examples of photopolymerization initiators, examples of oxime ester photopolymerization initiators include 1-[4-(phenylthio)phenyl]octane-1,2-dione-2-(O-benzoyl)oxime and 1-[9-ethyl-6-(2-methylbenzoyl)-9H-carbazole-3-yl]ethanone-1-(O-acetyl)oxime. Other known photopolymerization initiators can be used.

The gate insulating layer in the present invention may further include, as the photosensitive organic component, a compound that generates an acid by light (hereinafter, this is referred to as a "photoacid generator"). Illustrative examples of the photoacid generator include an onium salt compound, a halogen-containing compound, a diazoketone compound, a diazomethane compound, a sulfone compound, a sulfonate ester compound, and a sulfonimide compound.

Specific examples of the diazoketone compound include a 1,3-diketo-2-diazo compound, a diazo benzoquinone compound, and a diazonaphthoquinone compound. Among these compounds, in view of the patterning accuracy and the crack resistance of the gate insulating layer to be obtained, a diazonaphthoquinone compound is preferable. Preferable examples of the diazoketone compound include the ester of 1,2-naphthoquinonediazide-4-sulfonic acid with 2,2,3,4,4'-pentahydroxybenzophenone and the ester of 1,2-naphthoquinonediazide-4-sulfonic acid with 1,1,1-tris(4-hydroxyphenyl)ethane.

Furthermore, it is preferable that the photopolymerization initiator and the photoacid generator are used in a combination with a sensitizer, which is a photosensitive organic component. The sensitizer is not colored by a photofading reaction so that a high sensitivity can be obtained even in the gate insulating layer while keeping a high transparency. There is no particular restriction in the sensitizer so that any heretofore known sensitizer may be used; though a 9,10-disubstituted anthracene compound is especially preferable.

The gate insulating layer in the present invention may further include an addition reactant of a chain transfer agent as the photosensitive organic component.

The chain transfer agent is a compound that can receive a radical from a growing polymer terminal in the polymer chain obtained by radical polymerization at the time of irradiation with UV light, and then mediate the radical transfer to other polymer chain.

By including the chain transfer agent, the sensitivity at the time of irradiation with UV light can be enhanced. It is presumed that this occurs because the radical generated by irradiation with UV light migrates to other polymer chain by the chain transfer agent thereby causing radical crosslinking to a very deep part in the film. As the chain transfer agent, a thiol chain transfer agent is preferable.

Furthermore, the gate insulating layer in the present invention may include a polymerization inhibitor as the photosensitive organic component.

The polymerization inhibitor is the compound that captures a radical generated at the time of irradiation with UV light or a radical at a growing polymer terminal of the polymer chain formed by a radical polymerization at the time of irradiation with UV light thereby keeping it as a stable radical so that the radical polymerization can be terminated.

By including an appropriate amount of the polymerization inhibitor, an excess amount of radicals that are generated at the time of irradiation with UV light can be suppressed so that the radical polymerization can be controlled. As the polymerization inhibitor, a phenolic polymerization inhibitor is preferable.

A gate insulating layer in the present invention may further contain inorganic particles bound to no polymer as well as a polymer having inorganic particles bound thereto. A preferable material and shape of the inorganic particle bound to no polymer are the same as those of the above-mentioned inorganic particle bound to a polymer.

The gate insulating layer in the present invention may include, as needed, a viscosity adjusting material, a surfactant, a stabilizer, or the like. It does not matter even if the gate insulating layer includes a residual solvent.

Illustrative examples of the surfactant include a fluorine-based surfactant, a silicone-based surfactant, a polyalkyleneoxide-based surfactant, and an acryl-based surfactant.

Specific examples of the fluorine-based surfactant include Megafac F142D, Megafac F172, Megafac F173, and Megafac F183 (all of these surfactants are manufactured by DIC Corp.), as well as NBX-15, FTX-218, and DFX-18 (all of these surfactants are manufactured by NEOS Company Ltd.). Illustrative examples of the silicone-based surfactant include BYK-333 (manufactured by BYK Japan K.K.).

The gate insulating layer in the present invention preferably has a relative dielectric constant of 5 or more, more preferably 7 or more, still more preferably 8.5 or more, particularly preferably 10 or more. Having a relative dielectric constant in these ranges enables the FET to have larger on-current. In addition, the relative dielectric constant is preferably 20 or less, more preferably 15 or less, still more preferably 13.5 or less, particularly preferably 12 or less. A relative dielectric constant within these ranges can prevent the gate insulating layer from causing excessive dielectric loss, and makes it possible that, in particular, an FET driving at an electric wave in a high-frequency band of 100 MHz or more operates accurately. The relative dielectric constant $\varepsilon_r$ of the gate insulating layer can be calculated using the following equation (a).

$$\varepsilon_r = C \cdot D / (S \cdot \varepsilon_0) \tag{a}$$

Here, C(F) is the capacitance of the gate insulating layer, D(m) is the thickness of the gate insulating layer, S (m$^2$) is the area of the electrodes with the gate insulating layer sandwiched therebetween, and so is a vacuum dielectric constant (8.85×10$^{-12}$ F/m).

The thickness of the gate insulating layer in the present invention is preferably 10 nm or more, more preferably 25 nm or more, particularly preferably 50 nm or more. In addition, the thickness of the gate insulating layer is preferably 1000 nm or less, more preferably 750 nm or less, particularly preferably 500 nm or less. A thickness within these ranges facilitates the formation of a uniform thin film and decreases leak current. In addition, such a film thickness makes it possible that the current which cannot be controlled by the gate voltage and which is the current between the source and the drain is suppressed so that the on/off ratio of the FET can be further increased. The thickness of the gate insulating layer can be obtained from the arithmetic average of the values measured with a spectroscopic film thickness measurement system at 10 different points or more in the plane on the substrate.

In the gate insulating layer in the present invention, it is preferable that concentrations of an alkali metal and a halogen ion are low. Specifically, the concentration of any one of an alkali metal and a halogen ion is preferably 100 ppm or lower, more preferably 1 ppm or lower, while still more preferably 0.1 ppm or lower, in the whole region of the gate insulating layer.

The gate insulating layer in the present invention is composed of a single layer, or plural layers. In the case of plural layers, a plurality of the preferable gate insulating layers may be laminated, or the preferable gate insulating layer may be laminated with a heretofore known gate insulating layer.

Between the gate insulating layer and the semiconductor layer to be described later, an orientated layer may be disposed. As a material for the orientated layer, a heretofore known material such as a silane compound, a titanium compound, an organic acid, and a hetero organic acid may be used, while an organic silane compound is especially preferable.

<Second Insulating Layer>

The FET according to the present invention may have a second insulating layer to the semiconductor layer to be described later in the side opposite to the gate insulating layer. Note here that "to the semiconductor layer in the side opposite to the gate insulating layer" means, for example, when the gate insulating layer is disposed on the upper side of the semiconductor layer, the lower side of the semiconductor layer. By so doing, the threshold voltage and the hysteresis can be lowered so that the high performance FET can be obtained. The material to be used in the second insulating layer is not particularly restricted, in which specific examples thereof include inorganic materials such as silicon oxide and alumina, and polymer materials such as polyimides and derivatives thereof, polyvinyl alcohol, polyvinyl chloride, polyethylene terephthalate, polyvinylidene fluoride, polysiloxane and derivatives thereof, and polyvinyl phenol and derivatives thereof, as well as a mixture of powder of an inorganic material with the polymer material, and a mixture of an organic low-molecular weight material with the polymer material. Examples of materials for the insulating layer including the polysiloxane also include the same materials as for the preferable insulating layer. Among these materials, the polymer material that can be applied by means of an inkjet method or the like is preferable. In particular, polyfluoroethylene, polynorbornene, polysiloxane, polyimide, polystyrene, polycarbonate, polyacrylic acids, polymethacrylic acids, or derivatives thereof, or copolymers including these materials are preferable because when they are used, the effects to lower the threshold voltage and the hysteresis can be enhanced. Polyacrylic acid derivatives, polymethacrylic acid derivatives, or copolymers containing them are particularly preferable.

Film thickness of the second insulating layer is generally in the range of 50 nm to 10 μm, and preferably in the range of 100 nm to 3 μm. The second insulating layer may be a single layer or plural layers. One layer may be formed by plural insulating materials, or by laminating plural insulating materials.

The formation method of the second insulating layer is not particularly restricted. Therefore, dry methods such as a resistance heating evaporation method, an electron beam evaporation method, a sputtering method, and a CVD method may be used; but in view of a production cost and applicability to a large area, an application method is preferable. Illustrative examples of the application method include heretofore known application methods such as a spin coating method, a blade coating method, a slit die coating method, a screen printing method, a bar coating method, a casting method, a transfer printing method, an immersion and withdrawal method, and an inkjet method.

<Semiconductor Layer>

The semiconductor layer in the present invention contains CNTs. CNTs are excellent in that they have high carrier mobility and make it possible to use an inexpensive and convenient application process.

As the CNT, any of a single-walled CNT in which a sheet of a carbon film (graphene sheet) is cylindrically rolled, a double-walled CNT in which two sheets of the graphene film are concentrically rolled, and a multiple-walled CNT in which plural sheets of the graphene film are concentrically rolled may be used, in which a combination of two or more of them may also be used. In view of exhibiting the characteristics of the semiconductor, it is preferable to use a single-walled CNT. The single-walled CNT more preferably includes 90 mass % or larger of a semiconductor-type single-walled CNT. The single-walled CNT including 95 mass % or larger of the highly semiconductor enriched single-walled CNT is still more preferable.

The content ratio of the highly semiconductor enriched single-walled CNT may be calculated from the absorption area ratio of a visible to near infrared absorption spectrum. The CNT may be obtained by the method such as an arc-discharge method, a chemical vapor deposition method (CVD method), or a laser abrasion method.

A CNT composite having at least part of the CNT surface attached with a conjugated polymer is especially preferable because it has superior dispersion stability in a solution and can give a low hysteresis.

The state that a conjugated polymer is attached to at least part of the CNT surface means the state that the conjugated polymer covers a part or entire of the CNT surface. It is presumed that the conjugated polymer can cover the CNT because the π electron clouds derived from each of the conjugated structures are overlapped thereby generating an interaction with each other. Whether the CNT is covered with the conjugated polymer may be determined by whether the reflected color of the covered CNT approaches from the color of the uncovered CNT to the color of the conjugated polymer. Quantitatively, the presence of the attached material and the mass ratio of the attached material to the CNT may be identified by an elemental analysis, an X-ray photoelectron spectroscopy, and the like. The conjugated polymer to be attached to the CNT may be used regardless of the molecular weight, the molecular weight distribution, and the structure thereof.

Illustrative examples of the method to attach the conjugated polymer to the CNT include: (I) the method that the CNT is added to the molten conjugated polymer followed by mixing them; (II) the method that the CNT is added to a solution of the conjugated polymer dissolved in a solvent followed by mixing them; (III) the method that the conjugated polymer is added to the CNT dispersion solution previously dispersed in a solvent by means of ultrasonic waves or the like followed by mixing them; and (IV) the method that the conjugated polymer and the CNT are poured into a solvent followed by mixing the resulting mixed system by irradiating ultrasonic waves. Two or more of these methods may be combined.

The length of the CNT is preferably shorter than the distance (channel length) between the source electrode and the drain electrode. The average length of the CNT is preferably 2 μm or shorter, and more preferably 0.5 μm or shorter, though different depending on the channel length. There is a distribution in the length of the CNT generally commercially available so that the CNT longer than the channel length can be included therein; and thus, it is preferable to add the process in which the length of the CNT is shorter than the channel length. A cutting method so as to make the CNT to a short fiber, such as an acid treatment with nitric acid or sulfuric acid, or an ultrasonic treatment, or a freeze grinding method, is effective. Separation by means of a filter used concurrently is more preferable in view of increasing the purity thereof.

Diameter of the CNT is not particularly restricted, though the diameter is preferably at least 1 nm and up to 100 nm, and more preferably 50 nm or smaller.

It is preferable to have a process in which the CNT is uniformly dispersed in a solvent, and then, the dispersion liquid is filtrated through a filter. By collecting from the filtrate the CNT whose size is smaller than a filter pore diameter, the CNT whose length is shorter than the channel length can be efficiently obtained. In this case, a membrane filter is preferably used as the filter. The pore diameter of the filter to be used in the filtration may be any length so far as this is shorter than the channel length; and thus, it is preferably in the range of 0.5 μm to 10 μm.

Illustrative examples of the conjugated polymer to cover the CNT include a polythiophene type polymer, a polypyrrole type polymer, a polyaniline type polymer, a polyacetylene type polymer, a poly-p-phenylene type polymer, a poly-p-phenylene vinylene type polymer, and a thiophene-heteroarylene type polymer having a thiophene unit and a heteroaryl unit in the repeating unit thereof. These may also be used as a mixture of two or more of them. The polymers that can be used herein may be those in which the same monomer units are arranged, those in which different monomer units are block-copolymerized, randomly copolymerized, or graft-polymerized, or the like.

For the semiconductor layer, the CNT composite and the organic semiconductor may be mixed and used. When the CNT composite is uniformly dispersed in the organic semiconductor, the low hysteresis can be realized with keeping the inherent characteristics of the organic semiconductor.

A content of the CNT composite in the semiconductor layer including the CNT composite and the organic semiconductor is preferably at least 0.01 part by mass and up to 3 parts by mass, and more preferably 1 part by mass or smaller, relative to 100 parts by mass of the organic semiconductor.

Specific examples of the organic semiconductor include: polythiophenes such as poly-3-hexylthiophene and polybenzothiophene; compounds including in its main chain the thiophene units such as poly(2,5-bis(2-thienyl)-3,6-dipentadecylthieno[3,2-b]thiophene), poly(4,8-dihexyl-2,6-bis(3-hexylthiophen-2-yl)benzo[1,2-b:4,5-b']dithiophene), poly(4-octyl-2-(3-octylthiophen-2-yl)thiazole), and poly(5,5'-bis(4-octylthiazol-2-yl)-2,2'-bithiophene); polypyrroles; poly(p-phenylene vinylene) such as poly(p-phenylene vinylene); polyanilines; polyacetylenes, polydiacetylenes, polycarbazoles; polyfurans such as polyfuran and polybenzofuran; polyheteroaryls having constituent units of a nitrogen-containing aromatic ring such as pyridine, quinoline, phenanthroline, oxazole, and oxadiazole; condensed polycyclic aromatic compounds such as anthracene, pyrene, naphthacene, pentacene, hexacene, and rubrene; heteroaromatic compounds such as furan, thiophene, benzothiophene, dibenzofuran, pyridine, quinoline, phenanthroline, oxazole, and oxadiazole; aromatic amine derivatives represented by 4,4'-bis(N-(3-methylphenyl)-N-phenylamino)biphenyl; bis-carbazole derivatives such as bis(N-allylcarbazole) and bis(N-alkylcarbazole); pyrazoline derivatives; stilbene compounds; hydrazone compounds; metal phthalocyanines such as copper phthalocyanine; metal porphyrins such as copper porphyrin; distyrylbenzene derivatives; aminostyryl derivatives; aromatic acetylene derivatives; condensed ring tetra-carboxylic acid diimides such as naphthalene-1,4,5,8-tetra-carboxylate diimide and perylene-3,4,9,10-tetracarboxylic acid diimide; and organic dyes such as merocyanine, phenoxazine, and rhodamine. These may be included as a mixture of two or more of them.

The semiconductor layer may include another carbon material. Examples of other carbon materials to be used here include graphene and fullerene.

The semiconductor layer may further include an insulating material. Illustrative examples of the insulating material to be used herein include polymer materials such as poly (methyl methacrylate), polycarbonate, and polyethylene terephthalate, though not particularly limited to these.

The semiconductor layer may be a monolayer or multilayer. The film thickness of the semiconductor layer is preferably at least 1 nm and up to 200 nm, and more preferably 100 nm or smaller. When the film thickness is within this range, a uniform thin film can be readily formed; and in addition, the current that cannot be controlled by the gate voltage and that is the current between the source and the drain can be controlled, and the on/off ratio of the FET can be increased. The film thickness may be measured with an atomic force microscope, an ellipsometric method, or the like.

<Substrate>

As the material to be used as the substrate, any material may be used so far as at least the surface thereof to which the electrode system is disposed has an insulating property. Illustrative examples thereof to be preferably used include inorganic materials such as a silicon wafer, glass, sapphire, and a sintered alumina body, as well as organic materials such as polyimide, polyvinyl alcohol, polyvinyl chloride, polyethylene terephthalate, polyvinylidene fluoride, polysiloxane, polyvinyl phenol (PVP), polyester, polycarbonate, polysulfone, polyether sulfone, polyethylene, polyphenylene sulfide, and polyparaxylene.

In addition, the substrate having plural materials laminated, such as a PVP film formed on a silicon wafer, a polysiloxane film formed on polyethylene terephthalate, or the like, may be used.

<Electrode>

Illustrative examples of the material to be used in the gate electrode, the source electrode, and the drain electrode include electric conductive metal oxides such as tin oxide, indium oxide, and indium tin oxide (ITO); metals of platinum, gold, silver, copper, iron, tin, zinc, aluminum, indium, chromium, lithium, sodium, potassium, cesium, calcium, magnesium, palladium, molybdenum, amorphous silicon, and polysilicon, and alloys thereof; inorganic electric conductive materials such as copper iodide and copper sulfide; polythiophene, polypyrrole, and polyaniline; a complex of polyethylene dioxythiophene with polystyrenesulfonic acid; electric conductive polymers whose conductivity is enhanced by means of doping of iodine or the like; and electric conductive materials such as a carbon material. These materials may be used singly, or as a laminate, or as a mixture of these materials.

Preferable electric conductive materials contain at least one selected from silver, copper, gold, platinum, lead, tin, nickel, aluminum, tungsten, molybdenum, ruthenium oxide, chromium, titanium, carbon, and indium. In particular, electric conductive powders are preferable. The electric conductive powder can be used singly or as an alloy powder or a powder mixture.

Among these, in view of conductivity, silver, copper, and gold are preferable; while in view of a cost and stability, silver is more preferable. Furthermore, in view of lowering the resistivity at the time of the low temperature curing of the applied film, the concurrent use of silver and carbon black is still more preferable.

The volume-average particle size of the electric conductive powder is preferably at least 0.02 μm and up to 10 μm, more preferably at least 0.02 μm and up to 5 μm, while still more preferably at least 0.02 μm and up to 2 μm.

When the volume-average particle size is 0.02 μm or larger, the contact probability among the electric conductive powders is increased so that the relative resistivity and the breakage probability of the formed electric conductive pattern can be decreased. In addition, because an active beam can smoothly transmit through the film during exposure, a fine patterning can be readily carried out.

When the volume-average particle size is 10 μm or smaller, the surface smoothness, the pattern accuracy, and the size accuracy of the circuit pattern after printing can be enhanced. Besides, in thinning of the pattern, the particle size needs to be smaller. For example, when the antenna having the film thickness of 2 μm is formed, the particle size of the electric conductive powder also needs to be 2 μm or smaller.

The volume-average particle size can be calculated from the image of the electrode's section observed with a 3D-scanning electron microscope (SEM) or with a 3D-transmission electron microscope (TEM).

It is preferable that each of the electrodes includes an electric conductive powder and an organic binder. It is further preferable that the organic binder includes a photosensitive organic component.

When the organic binder is included in the semiconductor solution, the applicability of the semiconductor solution on the electrode can be improved so that a further uniform semiconductor layer having the organic semiconductor and the carbon material smoothly applied can be formed. In addition, when the organic binder includes the photosensitive organic component, patterning of the electrode can be carried out by means of a photolithography without using a resist, so that the productivity can be further improved.

In cases where the electrode has an organic binder, the electric conductive powder content is preferably at least 70 mass % and up to 95 mass %, and more preferably at least 80 mass % and up to 90 mass %, relative to the total mass of the electrode materials. When the content is 70 mass % or larger, the contact area among the electric conductive powders themselves increases, so that the relative resistivity and the breakage probability of the electric conductive pattern to be formed can be lowered. When the content is 95 mass % or smaller, an active beam can smoothly transmit through the film especially during exposure, so that a fine patterning can be readily carried out.

The photosensitive organic component includes a monomer, an oligomer, a polymer, these having a polymerizable unsaturated bond inside the molecule thereof, and/or addition reactants thereof.

As the monomer having a polymerizable unsaturated bond inside the molecule thereof, compounds having an active carbon-carbon unsaturated double bond may be used. Monofunctional or polyfunctional compounds having, as the functional group, a group selected from a vinyl group, an allyl group, an acrylate group, a methacrylate group, and an acrylamide group may be used. One kind or two or more kinds thereof can be used.

The above-mentioned monomer content is preferably in the range of 1 mass % to 15 mass %, and more preferably in the range of 2 mass % to 10 mass %, relative to the total parts by mass of the electrode material. When the monomer content is less than 1 mass %, the sensitivity becomes so low that satisfactory patterning is difficult. On the other hand, when the monomer content is larger than 15 mass %, the dried film becomes tacky so that a photomask contacts with this during exposure thereby causing problems of fouling of the photomask and irregularity of the coated film surface.

By adding a polymerizable unsaturated group to the oligomer or the polymer in the side chain or the molecular terminal thereof, the oligomer or the polymer having a polymerizable unsaturated group inside the molecule thereof can be obtained.

The preferable polymerizable unsaturated bond has an ethylenic unsaturated bond. Illustrative examples of the ethylenic unsaturated bond include a vinyl group, an allyl group, an acryl group, and a methacryl group.

As the method to add such a side chain to the oligomer or the polymer, there is the method in which an ethylenic unsaturated compound having a glycidyl group or an isocyanate group, or acrylic acid chloride, methacrylic acid chloride, or allyl chloride is caused to undergo an addition reaction to a mercapto group, an amino group, a hydroxy group, or a carboxyl group in the oligomer or the polymer. It is preferable that the ethylenic unsaturated compound having the glycidyl group or the isocyanate group, or acrylic acid chloride, methacrylic acid chloride, or allyl chloride is caused to undergo the addition reaction, with the amount thereof being 0.05 to 1 mole equivalent, to the mercapto group, the amino group, the hydroxy group, or the carboxyl group in the oligomer or the polymer.

In view of further enhancement in suppression effect to the pattern exfoliation upon folding of the electrode-attached substrate, it is preferable that the oligomer or the polymer mentioned above includes a urethane-modified compound that is formed by reacting the oligomer or the polymer having a hydroxy group in the side chain thereof with a compound having an isocyanate group.

In the oligomer or the polymer having the polymerizable unsaturated bond inside the molecule thereof, it is preferable that the mass-average molecular weight (Mw) is in the range or 2,000 to 200,000, and the number-average molecular weight (Mn) is in the range of 1,000 to 50,000; more preferable that Mw is in the range of 5,000 to 100,000 and Mn is in the range of 1,000 to 30,000. When Mw and Mn are within the ranges described above, handling thereof is convenient, and also a uniform cure can be achieved at the time of photocuring.

The electrode material is photocured, and accordingly, preferably contains a photopolymerization initiator. The photopolymerization initiator is selected in accordance with the light source to be used for photocuring, in which a radical photopolymerization initiator, a cationic photopolymerization initiator, or the like may be used.

The photopolymerization initiator content is preferably in the range of 0.05 mass % to 10 mass %, and more preferably in the range of 0.1 mass % to 10 mass %, relative to the total parts by mass of the electrode material. When the amount of the photopolymerization initiator is too small, the photocuring is insufficient; when the amount of the photopolymerization initiator is too large, compatibility can be deteriorated.

Concurrent use of a sensitizer with the photopolymerization initiator can enhance the sensitivity so that the wavelength range effective to the reaction can be expanded. When the electrode material includes the sensitizer, a content thereof is preferably in the range of 0.05 mass % to 10 mass %, and more preferably in the range of 0.1 mass % to 10 mass %, relative to the photosensitive organic component. When the amount of the sensitizer is too small, the effect to enhance photocuring cannot be expressed; when the amount of the sensitizer is too much, compatibility can be deteriorated.

The electrode material may include an organic binder so far as the desired characteristics are not impaired. The organic binder may include an additive such as a non-photosensitive polymer not having an unsaturated double bond inside the molecule thereof, a plasticizer, a leveling agent, a surfactant, a silane coupling agent, an anti-foaming agent, and a pigment. Specific examples of the non-photosensitive polymer include an epoxy resin, a novolac resin, a phenol resin, a polyimide precursor, and a polyimide.

Illustrative examples of the method for forming the electrode include the methods using heretofore known technologies such as resistance heating evaporation, electron beam evaporation, sputtering, plating, CVD, ion-plating coating, inkjetting, and printing. In addition, among others, the method is known in which the paste including the organic component and the electric conductive body is applied onto the insulating substrate with a heretofore known technology such as a spin coating method, a blade coating method, a slit die coating method, a screen printing method, a bar coater method, a casting method, a transfer printing method, and an immersion and withdrawal method, followed by drying using an oven, a hot plate, an infrared light, or the like to form the electrode. The method is not particularly restricted so far as the electric conduction can be obtained.

In cases where the electrode is formed of applied paste, the paste may contain an organic solvent so that the paste can be formed. When the organic solvent is used, viscosity of the paste can be adjusted so that the surface smoothness of the coated film can be enhanced.

The width and thickness of the electrode and the distance between the electrodes are arbitrary. It is preferable that the width of the electrode is in the range of 5 μm to 1 mm, that the thickness thereof is in the range of 0.01 μm to 100 μm, and that the distance between the electrodes is in the range of 1 μm to 500 μm; but the ranges are not limited to these values.

Patterning method of the electrode may be any of the method in which the electrode thin film obtained by the method mentioned above is patterned to an intended shape by means of a heretofore known photolithography method, and the method in which patterning is carried out via a mask having an intended shape at the time of evaporation or sputtering of the electrode, wiring, or the connecting part material. In addition, direct patterning may be carried out by using an inkjet method or a printing method.

The electrodes may be patterned separately, or at least two of them may be patterned at once. In view of reduction of the process and connection of the pattern, it is preferable to carry out the patterning of these electrodes all at once.

<Field-Effect Transistor>

Figure 2:
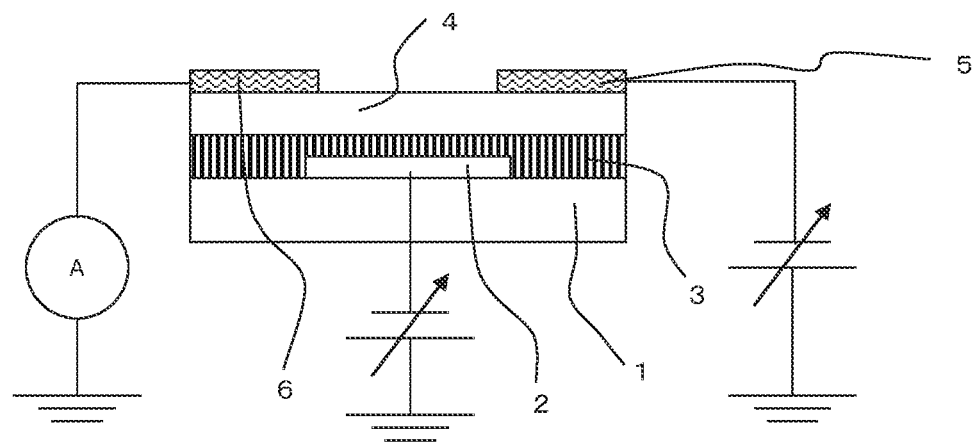
FIG. 2 is a schematic sectional view illustrating another example of the field-effect transistor according to the embodiment of the present invention.

FIG. 1 and FIG. 2 are schematic sectional views illustrating examples of the FET according to the embodiment of the present invention. In FIG. 1, after a source electrode 5 and a drain electrode 6 are formed on a substrate 1 having a gate electrode 2 covered with a gate insulating layer 3, a semiconductor layer 4 is further formed thereon. In FIG. 2, after the semiconductor layer 4 is formed on the substrate 1 having the gate electrode 2 covered with the gate insulating layer 3, the source electrode 5 and the drain electrode 6 are further formed thereon.

In the FET, the electric current between the source electrode and the drain electrode can be controlled by changing the gate voltage. The mobility of the FET can be calculated using the following formula (b).

$$\mu = (\delta Id/\gamma Vg) L \cdot D / (W \cdot \varepsilon_r \cdot \varepsilon_0 \cdot Vsd) \quad (b)$$

Here, Id (A) is the electric current between the source and the drain; Vsd (V) is the voltage between the source and the drain; Vg (V) is the gate voltage; D (m) is the thickness of the gate insulating layer; L (m) is the channel length; W (m) is the channel width; $\varepsilon_r$ is the relative dielectric constant of the gate insulating layer; and so is a vacuum dielectric constant ($8.85 \times 10^{-12}$ F/m).

The value of Id at Vg=−20 V was taken as an on-current.

The on/off ratio can be obtained from the ratio of Id at a certain minus gate voltage and Id at a certain plus gate voltage.

The hysteresis can be obtained from the absolute value $|Vg^1 - Vg^2|$ of the difference between the gate voltage $Vg^1$ at Id=$10^{-8}$ A upon applying Vg from plus to minus and the gate voltage $Vg^2$ at Id=$10^{-8}$ A upon applying Vg from minus to plus.

The threshold voltage can be obtained from the intersection point between the extended line of the linear portion and the Vg axis in the Id-Vg graph. The gate current value at Vg=−20 V was taken as the leak current.

<Production Method of FET>

The production method of the FET according to the present invention includes the steps of:

(1) forming, on a substrate, an electric conductive pattern serving as a gate electrode;

(2) applying a solution including at least a polymer having inorganic particles bound thereto onto the substrate having the electric conductive pattern formed thereon, followed by drying the solution, to obtain a coating film; and (3) forming, on the coating film or a gate insulating layer formed by curing the coating film, a semiconductor layer including a carbon nanotube and an electric conductive pattern serving as a source electrode and a drain electrode, in such a manner that the semiconductor layer and the electric conductive pattern are in contact with each other.

The production method of the FET according to the present invention is a method in which the solution including the polymer having inorganic particles bound thereto includes a photosensitive organic component, and the method preferably further includes the steps of:

(4) irradiating a film with active actinic light via a photomask, the film being obtained by applying, onto the substrate having the electric conductive pattern formed thereon, the solution including the polymer having inorganic particles bound thereto and the photosensitive organic component, and by drying the film; and forming, on the electric conductive pattern, an insulating pattern having an opening, using an alkali solution; and (5) heating the insulating pattern to faun a gate insulating layer having an opening.

Below, the production method of the FET whose configuration is illustrated in FIG. 1 will be explained. Note that the production method is not limited to the one described below.

First, an electric conductive pattern serving as the gate electrode 2 is formed on the substrate 1. Illustrative examples of a method for forming the electric conductive pattern include heretofore known methods such as a metal evaporation method, a spin coating method, a blade coating method, a slit die coating method, a screen printing method, a bar coating method, a casting method, a transfer printing method, an immersion and withdrawal method, and an inkjet method. To form an electric conductive pattern, the pattern may be directly formed by using a mask or the like, or the gate electrode may be patterned by the way that after a resist is applied onto the formed gate electrode, the resist film is exposed to form an desired pattern, developed, and then etched. Further, in the case when an electric conductive paste having the photosensitive organic component is used, the gate electrode may be patterned by means of photolithography without using the resist.

Next, the gate insulating layer 3 is formed on the substrate having the electric conductive pattern formed thereon. In a method of forming the gate insulating layer 3, a solution including a polymer having inorganic particles bound thereto is applied onto a substrate and dried to obtain a coating film, and the coating film is then heated to be cured. At least in this manner, the gate insulating layer 3 can be formed.

Illustrative examples of methods of applying a solution including a polymer having inorganic particles bound thereto include heretofore known application methods such as a spin coating method, a blade coating method, a slit die coating method, a screen printing method, a bar coating method, a casting method, a transfer printing method, an immersion and withdrawal method, and an inkjet method.

A solution including a polymer having inorganic particles bound thereto can contain a solvent to serve in a coating step. Though the solvent is not particularly restricted, examples thereof include ethers such as propylene glycol monomethyl ether, propylene glycol mono-n-butyl ether, propylene glycol mono-t-butyl ether, ethylene glycol diethyl ether, and diethylene glycol ethyl methyl ether; acetates such as propylene glycol monomethyl ether acetate, 3-methoxybutyl acetate, 3-methyl-3-methoxybutyl acetate, and ethyl lactate; ketones such as acetyl acetone, methyl isobutyl ketone, and cyclopentanone; alcohols such as 3-methyl-3-methoxybutanol and diacetone alcohol; and aromatic hydrocarbons such as toluene and xylene. These solvents may be used singly, or as a mixture of two or more of them.

The drying temperature for obtaining the coating film is preferably 50 to 150° C., more preferably 60 to 140° C., still more preferably 70° C. to 130° C., particularly preferably 80° C. to 120° C. It is preferable to have the drying temperature in these ranges from the viewpoint that such a temperature makes it easy to remove the solvent from the coating film and process a pattern in desired shape in the below-mentioned patterning. The drying time is preferably 0.5 to 5 minutes, more preferably 1 to 3 minutes. It is preferable to have the drying time in these ranges from the viewpoint that such a time makes it easy to remove the solvent from the coating film and process a pattern in a desired shape in the below-mentioned patterning.

Further, to cure the coating film to obtain a gate insulating layer, the heat-treatment temperature of the coating film is preferably in the range of 100 to 300° C., more preferably 120 to 250° C., still more preferably 140° C. to 200° C., particularly preferably 150° C. to 180° C. The heat-treatment temperature in these ranges makes it possible to obtain a sufficiently cured gate insulating layer. The heat-treatment temperatures of 200° C. or lower are more preferable from the viewpoint of the formation of an insulating layer on a plastic substrate, and make it possible to better suppress the shrinkage of the substrate in use. The heat-treatment time of the coating film is preferably 0.5 to 60 minutes, more preferably 5 to 30 minutes. The heat-treatment time in these ranges makes it possible to obtain a sufficiently cured gate insulating layer. A shorter heat-treatment time is more preferable from the viewpoint of the formation of an insulating layer on a plastic substrate, and makes it possible to better suppress the shrinkage of the substrate in use.

In the course of obtaining the gate insulating layer by the way as described above, patterning may be performed for the coating film or the insulating layer, if necessary. When a circuit combined with the FET according to the present invention is formed, in order to obtain an electric conduction from the electric conductive pattern that is present under the insulating layer, a pattern having an opening (contact hole) needs to be formed on the electric conductive pattern in some cases.

A method of forming a pattern of a coating film formed using a composition including a photosensitive organic component will be described. An actinic light is applied (exposed) through a mask having a desired pattern from above the coating film. Examples of the actinic light to be used for exposure include a UV light, a visible light, an electron beam, and an X-ray; but an i-line (365 nm), an h-line (405 nm), or a g-line (436 nm) of a mercury lamp is preferably used. Next, the coating film thus exposed is developed. As to the developing solution, an aqueous solution of an alkali compound such as tetramethyl ammonium hydroxide, diethanol amine, diethylamino ethanol, triethylamine, sodium hydroxide, potassium hydroxide, sodium carbonate, or potassium carbonate is preferable. These alkali compounds may be included singly or in combination of two or more kinds thereof. To these alkali aqueous solutions, a solvent may be mixed, in which illustrative examples of the solvent to be used include a polar solvent such as N-methyl-2-pyrrolidone and γ-butyrolactone; an alcohol such as isopropanol; an ester such as ethyl lactate and propylene glycol monomethyl ether acetate; and a ketone such as cyclopentanone and methyl isobutyl ketone. After development, usually rinsing is carried out by using water; but rinsing may also be carried out by water added with an alcohol such as ethanol or isopropanol, or with an ester such as ethyl lactate or propylene glycol monomethyl ether acetate.

The gate insulating layer can also be patterned by the process in which a resist is applied onto the gate insulating layer, and after the resist film is exposed and developed to a desired pattern, treated with an etching solution such as hydrofluoric acid. In this method, patterning can be carried out even in cases where the gate insulating layer is composed of a composition including no photosensitive organic component. However, the number of the processes increases, and thus, it is more preferable, from the viewpoint of a superior productivity, to pattern the gate insulating layer using the insulating layer material having a photosensitive organic component. Furthermore, in view of improvement in the crack resistance of the gate insulating layer to be obtained, it is preferable that the photosensitive organic component contains; a compound which generates a radical with the help of light; and a radical polymerizable compound; or a diazonaphthoquinone compound as a compound that generates acid with the help of light.

Next, an electric conductive pattern serving as the source electrode 5 and the drain electrode 6 is formed on the gate insulating layer. Similarly to the gate electrode 2, illustrative examples of methods for forming the source electrode 5 and the drain electrode 6 include heretofore known methods such as a metal evaporation method, a spin coating method, a blade coating method, a slit die coating method, a screen printing method, a bar coating method, a casting method, a transfer printing method, an immersion and withdrawal method, and an inkjet method. To form an electric conductive pattern, the pattern may be directly formed by using a mask or the like, or the source electrode and the drain electrode may be patterned by the way that after a resist is applied onto the electrodes formed, the resist film is exposed and developed to an intended pattern, and then etched. In the case when an electric conductive paste having the photosensitive organic component is used, the gate electrode may be patterned only from the electric conductive paste by means of photolithography without using the resist.

Next, a semiconductor layer 4 is formed on the gate insulating layer having the source electrode and the drain electrode formed thereon, so that an FET is obtained. To form the semiconductor layer 4, dry methods such as a resistance heating evaporation method, an electron beam evaporation method, a sputtering method, and a CVD method may be used, but in view of a production cost and applicability to a large area, an application method is preferable. Illustrative examples of the application method include heretofore known application methods such as a spin coating method, a blade coating method, a slit die coating method, a screen printing method, a bar coating method, a casting method, a transfer printing method, an immersion and withdrawal method, and an inkjet method. The application method can be selected in accordance with the film characteristics to be obtained, such as control of the film thickness and the orientation. These methods are used to form a semiconductor layer in such a manner that the semiconductor layer is mutually in contact with the electric conductive pattern serving as the source electrode 5 and the drain electrode 6.

In particular, in cases where a semiconductor layer containing CNTs is formed, it is preferable that the gate insulating layer is coated with a solution containing CNTs using a coating method. In this case, use of an inkjet method among coating methods is excellent in that the usage amount of the solution can be decreased and that the productivity can be enhanced. A solution containing CNTs can be produced by stirring CNTs in a solvent in a stirring treatment carried out using a known dispersing device such as an ultrasonic homogenizer.

In cases where a semiconductor layer is formed using a coating method, the drying treatment is carried out to the film thus found under the atmospheric air, under a reduced pressure, or under an inert gas (nitrogen or argon) atmosphere. The drying temperature is preferably in the range of 50 to 150° C.

A step may be added in which an orientated layer may be formed between the gate insulating layer 3 and the semiconductor layer 4 using the same method as formation of the coating film of the material for the gate insulating layer. Alternatively, a step may be added in which a second insulating layer may be formed on the opposite side of the semiconductor layer 4 from the gate insulating layer 3 using the same method as formation of the semiconductor layer 4.

The FET according to the present invention may be advantageously used in various devices such as a thin film FET, a photovoltaic device, a switching device, as well as a display, a wireless communication device, and a goods tag, using these devices.

<Wireless Communication Device>

The wireless communication device that includes the FET according to the present invention will be explained. Here, the wireless communication device is the device in which an electric communication is effected by receiving a carrier wave sent from an antenna that is mounted in the reader/writer such as RFID (Radio Frequency Identification), which is a non-contact type tag. In a specific action, for example, a radio signal sent from the antenna that is mounted in the reader/writer is received by the antenna of the RFID tag thereby converting it to a direct current by means of a rectifier circuit so that the RFID tag is electrified. Next, the electrified RFID tag receives a command from the radio signal, and then acts in response to the command. Thereafter, the answer to the result in response to the command is sent from the antenna of the RFID tag to the antenna of the reader/writer by means of a radio signal. Here, the action in response to the command is carried out by a demodulation circuit, a control logic circuit, a modulation circuit, and the like.

Figure 3:
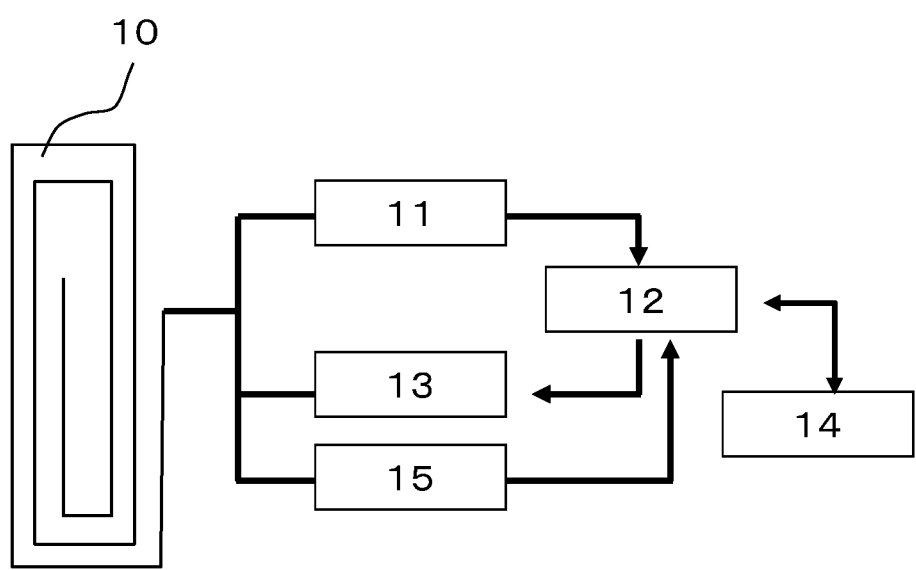
FIG. 3 is a block diagram illustrating an example of the wireless communication device using the field-effect transistor according to the embodiment of the present invention.

The wireless communication device according to the present invention has at least the FET and the antenna as described above. More specifically, the configuration of the wireless communication device may be exemplified, for example, as illustrated in FIG. 3, by the device that is composed of: a power source generating unit 15 in which a modulated wave signal from outside received by the antenna 10 is rectified so as to deliver the power source to each unit; a demodulation circuit 11 in which the modulated wave signal is demodulated so as to be sent out to a control circuit 12; a modulation circuit 13 in which the data sent from the control circuit is modulated so as to be sent out to the antenna; and the control circuit in which the data demodulated in the demodulation circuit 11 is written in a memory circuit 14 and the data is read out from the memory circuit 14 so as to be sent out to the modulation circuit 13, in which these circuit units are connected electrically. The demodulation circuit, the control circuit, the modulation circuit, and the memory circuit are composed of the above-mentioned FET, and in addition, they may further include a capacitor, a resistance element, and a diode. The memory circuit may further include a non-volatile rewritable memory unit such as EEPROM (Electrically Erasable Programmable Read-Only Memory) and FeRAM (Ferroelectric Random Access Memory). Here, the power source generating unit is composed of a capacitor and a diode.

As the antenna, the capacitor, the resistance element, the diode, and the non-volatile rewritable memory unit, any of those generally used may be used; and the material to be used and the shape thereof are not particularly restricted. As the material that connects them electrically, any electric conductive material that can be generally used may be used. The connecting method among them may be any method so far as it can obtain an electric conduction; and the width and thickness of the connecting part are arbitrary.

<Goods Tag>

The goods tag including the wireless communication device according to the present invention will be explained. This goods tag has, for example, a base and the wireless communication device covered with this base.

The base is formed of, for example, a non-metallic material such as a paper formed into a planar shape. For example, the base has a structure that two sheets of planar paper are bonded together, and the wireless communication device is disposed between these two sheets of paper. In the memory circuit of the wireless memory device, for example, the individual identification information to identify the individual goods is stored in advance.

The wireless communication is effected between the goods tag and the reader/writer. The reader/writer is the device with which the data to the goods tag are read and written wirelessly, thereby exchanging the data with the goods tag when the goods is in the distribution process or at the time of the account settlement. Any heretofore known reader/writer may be used. For example, there is a mobile type as well as a fixed type disposed in a cash register.

Specifically, the goods tag is provided with a reply function of the identification information with which the memorized individual identification information is replied wirelessly in response to the command from a prescribed reader/writer requesting to send the individual identification information. With this, for example, at a cash register of the goods, a large number of the goods can be simultaneously identified in a contactless manner, so that the settlement can be facilitated or made easier as compared with the identification with a barcode.

For example, at the time of payment for the goods, when the goods information that the reader/writer reads from the goods tag is sent to the POS (Point of Sale System) terminal, the sales registration of the goods that is identified by the goods information can be made in the POS terminal.

EXAMPLES

Hereinafter, the present invention will be explained by presenting Examples, but the present invention is not limited by these Examples. The evaluation methods in Examples will be explained in the following (1) to (9).

(1) Preparation of the Coating Film

A gate insulating material was applied onto a 6-inch silicon wafer, a 5 cm glass substrate, and a 5 cm aluminum substrate by means of a spin coater so as to give the film thickness of 400 nm (after being dried), unless otherwise specified, followed by drying by using a hot plate at 110° C. for 2 minutes, to obtain a coating film.

(2)-1 Preparation of the Gate Insulating Layer (a)

Among insulating materials, a material including no radical polymerizable compound was used to prepare the gate insulating layer by the method described below. The coating film formed on each substrate and prepared by the method described in the above-mentioned (1) was developed with a 2.38 mass % tetramethyl ammonium hydroxide (TMAH) aqueous solution (ELM-D, manufactured by Mitsubishi Gas Chemical Company, Inc.) for 60 seconds, and then, rinsed with purified water. The film thus obtained was heated at 180° C. for 60 minutes using a hot plate to obtain a gate insulating layer.

(2)-2 Preparation of the Gate Insulating Layer (b)

In a case where a material having a radical polymerizable compound is used among insulating materials, a gate insulating layer was prepared by the method described below. The coating film formed on each substrate and prepared with the method described in the above-mentioned (1) was set to an i-line stepper (DSW-8000, manufactured by GCA Corp.), and then, the whole surface of the coating film was exposed at an exposure amount of 100 to 800 mJ/cm². After the exposure, the film was developed with a 2.38 mass % TMAH aqueous solution (ELM-D, manufactured by Mitsubishi Gas Chemical Company, Inc.) for 60 seconds, and then, rinsed with purified water. The film thus obtained was heated at 180° C. for 60 minutes using a hot plate to obtain a gate insulating layer.

(3) Elemental Analysis

A soft X-ray was applied to a target film to be measured under an ultrahigh-vacuum condition; and by an X-ray photoelectron spectroscopy (Quantera SXM, manufactured by Physical Electronics, Inc. (PHI)), which detects photoelectrons emitted from the surface, the element information and the element amounts in the film were analyzed.

(4) Measurement of Relative Dielectric Constant of the Gate Insulating Layer

A circular aluminum electrode having a diameter of 5 mm was further formed, by evaporation, on the insulating layer formed on the aluminum substrate and prepared with the method described in the above-mentioned (2). This film was measured for capacitance using a precision impedance analyzer (Model 4294A, manufactured by Agilent Technologies, Inc.) at 25° C. at 1 MHz. On the basis of the above-mentioned conditions and measured values, the relative dielectric constant $\varepsilon_r$ of the gate insulating layer was determined in accordance with the equation (a).

(5) Measurement of Number-Average Particle Size of Inorganic Particles

The insulating layer formed on the silicon wafer and prepared with the method described in the above-mentioned (2) was used. The substrate was broken to expose a cross section of the insulating layer. A scanning electron microscope (SEM, S-4800, manufactured by Hitachi High-Technologies Corporation) was used at a magnification ratio of 200,000× to directly observe and measure the cross section of the insulating layer in the following manner. The longest diameter (hereinafter "long axis diameter") of the particle and the diameter (hereinafter "short axis diameter") longest in the direction perpendicular to the long axis diameter were measured, and the two-axis average diameter obtained by averaging the long axis diameter and the short axis diameter was regarded as the particle size of the particle. This particle size measurement was made on randomly selected 20 particles, and the arithmetic average of the measurements was determined as the number-average particle size.

(6) Measurement of Volume Fraction of Inorganic Particles

Volume fractions were measured in the following manner on the basis of density measurement using a precision electronic balance. First, a polymer having no inorganic particle added thereto was also synthesized when a polymer having inorganic particles bound thereto was synthesized. The polymers were separately used to prepare insulating layers with the method described in the above-mentioned (2). Here, the density of the film was determined from the change difference in the mass of the substrate between before and after coating and from the coating area/the insulating layer thickness. Then, the volume fraction of the inorganic particles was calculated from: the density of the insulating layer in which the polymer having no inorganic particle bound thereto is used; the density of the inorganic particles themselves; and the density of the insulating layer in which the polymer having inorganic particles bound thereto is used.

(7) Measurement of Thickness of the Gate Insulating Layer

By using a spectroscopic film thickness measurement system (Lambda Ace STM-602, manufactured by Dainippon Screen Mfg. Co., Ltd.), the film thickness was measured at 10 different points in the plane on the substrate at the refractive index of 1.70; and the arithmetic average of these values was obtained as the film thickness of the gate insulating layer.

(8) Evaluation of Applicability of the Semiconductor Solution

A contact angle measurement instrument (CA-D type, manufactured by Kyowa Interface Science, Inc.) was used. A droplet of the semiconductor solution with a diameter of 1.5 mm was formed at the needle tip at room temperature; and then, contacted to the gate insulating layer on the 6-inch silicon wafer that was prepared by the way described in (2) to form a droplet thereon. The angle of the formed droplet with the surface thereof was measured as the contact angle. This was tested as described below. A+, A, B, and C were determined to have passed the test because these semiconductor solutions had good applicability.

A+: A contact angle was at least 7° and less than 9°.

A: A contact angle was at least 6° and less than 7°, or at least 9° and less than 10°.

B: A contact angle was at least 5° and less than 6°, or at least 10° and less than 12°.

C: A contact angle was at least 4° and less than 5°, or at least 12° and less than 15°.

D: A contact angle was at least 3° and less than 4°, or at least 15° and less than 20°.

E: A contact angle was less than 3° or 20° or higher.

(9) Evaluation of FET Characteristics

Upon changing the gate voltage (Vg) in the produced FET, the characteristic with regard to the current (Id) between the source and the drain and the voltage between the source and the drain (Vsd) (Id-Vsd characteristic) was measured. In the measurement, the semiconductor characteristic evaluation system (4200-SCS type, manufactured by Keithley Instruments, Inc.) was used under the atmospheric air (temperature at 20° C. and humidity of 35%). From the drain current value at Vg=−20 V, the on-current was obtained. This was tested as described below. A+, A, B, and C were determined to have passed the test because these indicated high on-currents.

A+: On-current was 100 µA or higher.

A: On-current was lower than 100 µA and 50 µA or higher.

B: On-current was lower than 50 µA and 20 µA or higher.

C: On-current was lower than 20 µA and 5 µA or higher.

D: On-current was lower than 5 µA and 1 µA or higher.

E: On-current was lower than 1 µA.

In addition, from the gate current value at Vg=−20 V, the leak current was obtained. This was tested as described below. A+, A, B, and C were determined to have passed the test because these indicated low leak currents.

A+: Leak current was up to 10 pA.

A: Leak current was higher than 10 pA and up to 20 pA.

B: Leak current was higher than 20 pA and up to 35 pA.

C: Leak current was higher than 35 pA and up to 50 pA.

D: Leak current was higher than 50 pA and up to 100 pA.

E: Leak current was higher than 100 pA.

Example 1

(1) Preparation of Semiconductor Solution

Into a flask containing 5 mL of chloroform was charged 0.10 g of poly-3-hexylthiophene (P3HT, manufactured by Aldrich Inc.; regioregular; number-average molecular weight (Mn) of 13,000); and then, the mixture was stirred by mans of ultrasonic waves using an ultrasonic cleaning device (US-2; output power of 120 W, manufactured by Iuchi Seieido Co., Ltd.) to obtain a chloroform solution of P3HT. Next, this solution was taken into a pipette; and then, the solution was added into a mixed solution of 20 mL of methanol and 10 mL of 0.1-N hydrochloric acid dropwise with an amount of 0.5 mL at a time to effect reprecipitation. The solid P3HT thereby precipitated was collected by filtration by means of a membrane filter (tetrafluoroethylene, manufactured by PTFE Inc.) having a pore diameter of 0.1 µm; and then, after the resultant solid was thoroughly rinsed with methanol, the solvent was removed by means of vacuum drying. Dissolution and reprecipitation each were repeated once more to obtain 90 mg of reprecipitated P3HT.

Next, 1.5 mg of CNT (single-walled CNT; purity of 95%, manufactured by CNI Inc.) and 1.5 mg of the above-mentioned P3HT were added into 15 mL of chloroform; and then, the mixture was stirred with cooling by ice by means of ultrasonic waves using an ultrasonic homogenizer (VCX-500, manufactured by Tokyo Rikakikai Co., Ltd.) with an output power of 250 W for 30 minutes. When irradiation with the ultrasonic waves was effected for 30 minutes, the irradiation was stopped once, and 1.5 mg of the P3HT was further added. The resulting mixture was irradiated with the ultrasonic waves for further 1 minute to obtain the CNT dispersion liquid A including the CNT composite having P3HT on the CNT surface (CNT composite concentration to the solvent was 0.1 g/L).

Next, the semiconductor solution to form the semiconductor layer 4 was prepared. The obtained CNT dispersion liquid A was filtrated by using a membrane filter (Omnipore Membrane; pore diameter of 10 µm and diameter of 25 mm, manufactured by Millipore Inc.) to remove the CNT composite having the length of 10 µm or longer. By adding 45 mL of dichlorobenzene to 5 mL of the filtrate thus obtained, the semiconductor solution A was obtained (CNT composite concentration to the solvent was 0.01 g/L).

(2) Synthesis of Polysiloxane Having Inorganic Particles Bound Thereto (PS-01)

In a three-neck flask, 10.90 g (0.08 mol) of methyl trimethoxy silane (MeSi), 5.25 g (0.02 mol) of 3-trimethoxysilylpropylsuccinic acid anhydride (SucSi), 24.84 g (0.10 mol) of 1-naphthyl trimethoxy silane (NapSi), 133.68 g of "OPTOLAKE (registered trademark)" TR-550 (manufactured by JGC Catalysts & Chemicals Ltd.) which was a 20.6 mass % titanium oxide-silicon oxide composite particles methanol dispersion liquid (the particle content was 100 parts by mass relative to the mass (27.54 g) of completely condensed organosilane as 100 parts by mass), and 102.28 g of diacetonealcohol (DAA, having a boiling point of 168° C.) were fed, and the resulting mixture was stirred at room temperature, during which a phosphoric acid aqueous solution of 0.205 g (0.50 mass % relative to the fed monomer) of phosphoric acid dissolved in 11.16 g of water was added over 10 minutes. Then, the resulting mixture was stirred for 60 minutes with the flask dipped in an oil bath at 40° C., and then, the oil bath temperature was raised to 115° C. over 30 minutes. The temperature inside the solution reached 100° C. one hour after the start of temperature-raising, and then, the mixture was heated with stirring for 2 hours (the inside temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-01). In this regard, nitrogen was allowed to flow at 0.05 l (liter)/minute during the temperature-raising and heating/stirring. During the reaction, by-product methanol and water were distilled in a total amount of 121.19 g. The solid concentration of the obtained solution PS-01 of polysiloxane having inorganic particles bound thereto was 33 mass %.

(3) Synthesis of Naphthoquinonediazide Compound (QD-01)

Under a dry nitrogen stream, 15.32 g (0.05 mole) of Ph-cc-AP-MF (trade name; manufactured by Honshu Chemical Industry Co., Ltd.) and 37.62 g (0.14 mole) of 5-naphtoquinonediazido sulfonyl chloride were dissolved into 450 g of 1,4-dioxane. After the temperature of the resulting solution was set at room temperature, a mixture of 15.58 g (0.154 mole) of triethylamine with 50 g of 1,4-dioxane was added dropwise so as not to raise the temperature inside the system to 35° C. or higher. After the dropwise addition, the reaction solution was stirred at 30° C. for 2 hours. After the trimethyl ammonium salt was removed by filtration, the filtrate was poured into water. Then, the separated precipitate was collected by filtration. This precipitate was dried using a vacuum dryer to obtain a quinonediazide compound (QD-01) having the following structure.

(4) Preparation of Insulating Material Solution

Under yellow light, 69.49 g of the solution (PS-01) of polysiloxane having inorganic particles bound thereto, 2.06 g of the quinonediazide compound (QD-01), 100 ppm of DFX-18 (a fluorine-based surfactant, manufactured by Neos Company Ltd.), 100.06 g of DAA, and 36.65 g of PGMEA were mixed, and the resulting mixture was stirred to make a uniform solution, followed by filtration through a 0.20 µm filter, to obtain an insulating material solution (having a solid concentration of 12 mass %).

[Chem. 4]

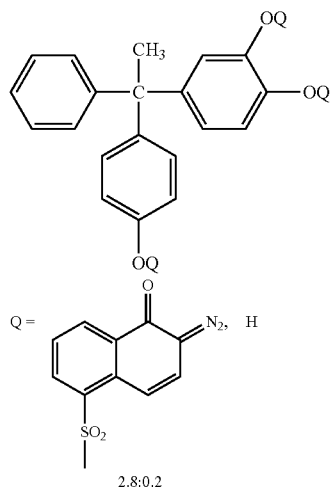

(5) Preparation of FET

The FET illustrated in FIG. 1 was prepared. On the substrate 1 made of glass (film thickness of 0.7 mm), gold was vacuum-evaporated through a mask by means of a resistance heating evaporation to form the gate electrode 2 having the gold thickness of 50 nm. Next, the above-mentioned glass substrate with the gate electrode 2 formed thereon was coated, by spin coating (800 rpm×20 seconds), with the insulating material solution prepared with the method described in the above-mentioned (4), and the resulting film was heat-treated at 110° C. for 2 minutes, followed by 60-second development with a 2.38 mass % TMAH aqueous solution (ELM-D, manufactured by Mitsubishi Gas Chemical Company, Inc.). Then, the film thus obtained was rinsed with pure water, and heated at 180° C. for 60 minutes using a hot plate to form the gate insulating layer 3 having a film thickness of 400 nm. Next, gold was vacuum-evaporated on the gate insulating layer 3 by means of resistance heating so as to give the film thickness of 50 nm, onto which a photoresist (trade name of "LC140-10cP"; manufactured by Rohm & Haas Co.) was applied by means of a spin coating method (1,000 rpm for 20 seconds); followed by drying by heating at 100° C. for 10 minutes. The prepared photoresist film was pattern-exposed through a mask by using a parallel light mask aligner (PLA-501F, manufactured by Canon Inc.), developed with a 2.38 mass % TMAH aqueous solution ELM-D (trade name; manufactured by Mitsubishi Gas Chemical Company, Inc.) for 60 seconds by means of a shower development using an autodeveloping apparatus (AD-2000, manufactured by Takizawa Sangyo K. K.); and then, rinsed with water for 30 seconds. Thereafter, the film was etched with AURUM-302 (trade name, manufactured by Kanto Chemical Co., Inc.) for 5 minutes; and then, rinsed with water for 30 seconds. Next, the resist was removed by soaking it in AZ Remover 100 (trade name; manufactured by Merk Performance Materials Ltd.) for 5 minutes and rinsed with water for 30 seconds; followed by drying by heating at 120° C. for 20 minutes to form the source electrode 5 and the drain electrode 6.

The widths (channel widths) of both electrodes were 100 µm; and the distance (channel length) between both electrodes was 10 µm. Onto the substrate having the electrodes formed thereon, 400 pL of the semiconductor solution A prepared with the method described in the above-mentioned (1) was dropped by using an inkjet apparatus (manufactured by Cluster Technology Co., Ltd.); and then, heat-treated on a hot plate under a nitrogen gas stream at 150° C. for 30 minutes to form the semiconductor layer 4, thereby obtaining the FET. The FET thus obtained was evaluated in accordance with the evaluation methods (1) to (9).

Example 2

An FET was prepared and evaluated in the same manner as in Example 1 except that a polysiloxane having inorganic particles bound thereto was synthesized and used in accordance with the below-mentioned procedures.

In a three-neck flask, 10.90 g (0.08 mol) of MeSi, 5.25 g (0.02 mol) of SucSi, 24.84 g (0.10 mol) of NapSi, 33.42 g of the 20.6 mass % TR-550 (the particle content was 25 parts by mass relative to the mass (27.54 g) of completely condensed organosilane as 100 parts by mass), and 63.93 g of DAA were fed, and the resulting mixture was stirred at room temperature, during which a phosphoric acid aqueous solution of 0.205 g (0.50 mass % relative to the fed monomer) of phosphoric acid dissolved in 11.16 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-02). In this regard, nitrogen was allowed to flow at 0.05 l (liter)/minute during the temperature-raising and heating/stirring. During the reaction, by-product methanol and water were distilled in a total amount of 45.16 g. The solid concentration of the obtained solution PS-02 of polysiloxane having inorganic particles bound thereto was 33 mass %.

Example 3

An FET was prepared and evaluated in the same manner as in Example 1 except that a polysiloxane having inorganic particles bound thereto was synthesized and used in accordance with the below-mentioned procedures.

In a three-neck flask, 10.90 g (0.08 mol) of MeSi, 5.25 g (0.02 mol) of SucSi, 24.84 g (0.10 mol) of NapSi, 200.52 g of the 20.6 mass % TR-550 (the particle content was 150 parts by mass relative to the mass (27.54 g) of completely condensed organosilane as 100 parts by mass), and 127.85 g of DAA were fed, and the resulting mixture was stirred at room temperature, during which a phosphoric acid aqueous solution of 0.205 g (0.50 mass % relative to the fed monomer) of phosphoric acid dissolved in 11.16 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-03). In this regard, nitrogen was allowed to flow at 0.05 l (liter)/minute during the temperature-raising and heating/stirring. During the reaction, by-product methanol and water were distilled in a total amount of 171.88 g. The solid concentration of the obtained solution PS-03 of polysiloxane having inorganic particles bound thereto was 33 mass %.

Example 4

An FET was prepared and evaluated in the same manner as in Example 1 except that a polysiloxane having inorganic particles bound thereto was synthesized and used in accordance with the below-mentioned procedures.

In a three-neck flask, 10.90 g (0.08 mol) of MeSi, 5.25 g (0.02 mol) of SucSi, 24.84 g (0.10 mol) of NapSi, 267.36 g of the 20.6 mass % TR-550 (the particle content was 200 parts by mass relative to the mass (27.54 g) of completely condensed organosilane as 100 parts by mass), and 153.42 g of DAA were fed, and the resulting mixture was stirred at room temperature, during which a phosphoric acid aqueous solution of 0.205 g (0.50 mass % relative to the fed monomer) of phosphoric acid dissolved in 11.16 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-04). In this regard, nitrogen was allowed to flow at 0.05 l (liter)/minute during the temperature-raising and heating/stirring. During the reaction, by-product methanol and water were distilled in a total amount of 222.56 g. The solid concentration of the obtained solution PS-04 of polysiloxane having inorganic particles bound thereto was 33 mass %.

Example 5

An FET was prepared and evaluated in the same manner as in Example 1 except that a polysiloxane having inorganic particles bound thereto was synthesized and used in accordance with the below-mentioned procedures.

In a three-neck flask, 10.90 g (0.08 mol) of MeSi, 5.25 g (0.02 mol) of SucSi, 24.84 g (0.10 mol) of NapSi, 401.03 g of the 20.6 mass % TR-550 (the particle content was 300 parts by mass relative to the mass (27.54 g) of completely condensed organosilane as 100 parts by mass), and 204.57 g of DAA were fed, and the resulting mixture was stirred at room temperature, during which a phosphoric acid aqueous solution of 0.205 g (0.50 mass % relative to the fed monomer) of phosphoric acid dissolved in 11.16 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-05). In this regard, nitrogen was allowed to flow at 0.05 l (liter)/minute during the temperature-raising and heating/stirring. During the reaction, by-product methanol and water were distilled in a total amount of 323.93 g. The solid concentration of the obtained solution PS-05 of polysiloxane having inorganic particles bound thereto was 33 mass %.

Example 6

An FET was prepared and evaluated in the same manner as in Example 1 except that a polysiloxane having inorganic particles bound thereto was synthesized and used in accordance with the below-mentioned procedures.

In a three-neck flask, 16.34 g (0.12 mol) of MeSi, 19.87 g (0.08 mol) of NapSi, 108.80 g of the 20.6 mass % TR-550 (the particle content was 100 parts by mass relative to the mass (22.41 g) of completely condensed organosilane as 100 parts by mass), and 83.24 g of DAA were fed, and the resulting mixture was stirred at room temperature, during which a phosphoric acid aqueous solution of 0.181 g (0.50 mass % relative to the fed monomer) of phosphoric acid dissolved in 10.80 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-06). In this regard, nitrogen was allowed to flow at 0.05 l (liter)/minute during the temperature-raising and heating/stirring. During the reaction, by-product methanol and water were distilled in a total amount of 103.21 g.

The solid concentration of the obtained solution PS-06 of polysiloxane having inorganic particles bound thereto was 33 mass %.

Example 7

An FET was prepared and evaluated in the same manner as in Example 1 except that a polysiloxane having inorganic particles bound thereto was synthesized and used in accordance with the below-mentioned procedures.

In a three-neck flask, 8.17 g (0.06 mol) of MeSi, 10.49 g (0.04 mol) of SucSi, 24.84 g (0.10 mol) of NapSi, 147.67 g of the 20.6 mass % TR-550 (the particle content was 100 parts by mass relative to the mass (30.42 g) of completely condensed organosilane as 100 parts by mass), and 112.99 g of DAA were fed, and the resulting mixture was stirred at room temperature, during which a phosphoric acid aqueous solution of 0.218 g (0.50 mass % relative to the fed monomer) of phosphoric acid dissolved in 11.52 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-07). In this regard, nitrogen was allowed to flow at 0.05 l (liter)/minute during the temperature-raising and heating/stirring. During the reaction, by-product methanol and water were distilled in a total amount of 131.30 g. The solid concentration of the obtained solution PS-07 of polysiloxane having inorganic particles bound thereto was 33 mass %.

Example 8

In a four-neck flask, 54.68 g of water, 2.77 g of ethanol, 332.84 g of the 25.0 mass % TR-550 (wherein, as the solvent, methanol was replaced with ethanol using an evaporator) (the inorganic particle solid content was 100 parts by mass relative to a total of 100 parts by mass of the below-mentioned acryl monomer), 11.89 g of 25 mass % ammonia aqueous solution, and 3.72 g (3 mol %) of 3-methacryloxy-propyl trimethoxy silane were fed, and the flask was dipped in an oil bath at 55° C. The resulting mixture was stirred with heating under reflux for 2 hours. Next, the resulting mixture was cooled to room temperature, and 8.51 g (17 mol %) of methyl methacrylate, 12.91 g (30 mol %) of methacrylic acid, 58.07 g (50 mol %) of 2-[2-(2-methoxy)ethoxy]ethoxyethyl methacrylate, and 2.46 g of ethanol were fed in a flask. The resulting mixture was stirred for a while, and the flask was sufficiently purged by bubbling with nitrogen. The flask was dipped in an oil bath, the temperature of which was raised, and when the internal temperature reached 70° C., 11.41 g of 10 mass % ammonium persulfate aqueous solution was added. The resulting mixture was stirred under a nitrogen atmosphere with heating under reflux for 5 hours. Then, using an evaporator, the solvent mixture used in polymerization was replaced with a DAA solvent to obtain an acryl resin solution (AC-TR550). DAA was added to the obtained acryl resin solution (AC-TR550) so that the solid concentration could become 33 mass %. An FET was prepared and evaluated in the same manner as in Example 1 except that AC-TR550 was used as a polymer having inorganic particles bound thereto.

Example 9

An FET was prepared and evaluated in the same manner as in Example 1 except that a solution of polysiloxane (PS-8) having inorganic particles bound thereto was obtained using, in place of TR-550, "Quartron (registered trademark)" PL-2L-MA (manufactured by Fuso Chemical Co., Ltd.) which was a 22.5 mass % silicon oxide particles methanol dispersion liquid.

Example 10

An FET was prepared and evaluated in the same manner as in Example 1 except that a solution of polysiloxane (PS-9) having inorganic particles bound thereto was obtained using, in place of TR-550, "OSCAL (registered trademark)" 1727BM (manufactured by JGC Catalysts & Chemicals Ltd.) which was a silicon oxide particles methanol dispersion liquid.

Example 11

A polysiloxane having inorganic particles bound thereto was synthesized in accordance with the below-mentioned procedures.

In a three-neck flask, 18.75 g (0.08 mol) of 3-acryloxy-propyl trimethoxy silane (AcrSi), 5.25 g (0.02 mol) of SucSi, 24.84 g (0.10 mol) of NapSi, 171.78 g of the 20.6 mass % TR-550 (the particle content was 100 parts by mass relative to the mass (35.39 g) of completely condensed organosilane as 100 parts by mass), and 131.44 g of DAA were fed, and the resulting mixture was stirred at room temperature, during which a phosphoric acid aqueous solution of 0.244 g (0.50 mass % relative to the fed monomer) of phosphoric acid dissolved in 11.16 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane having inorganic particles bound thereto (PS-10). In this regard, nitrogen was allowed to flow at 0.05 l (liter)/minute during the temperature-raising and heating/stirring. During the reaction, by-product methanol and water were distilled in a total amount of 148.73 g. The solid concentration of the obtained solution PS-10 of polysiloxane having inorganic particles bound thereto was 33 mass %.

Then, 2.29 g of DPHA ("KAYARAD (registered trademark)", dipentaerythritol hexaacrylate, manufactured by Nippon Kayaku Co., Ltd.) and 0.34 g of OXE-01 ("Irgacure (registered trademark)", manufactured by BASF) were used in place of QD-01 to obtain an insulating material solution.

The DPHA content of the solution was 10 parts by mass relative to 100 parts by mass of the polysiloxane. The OXE-01 content of the solution was 1.5 parts by mass relative to 100 parts by mass of the polysiloxane. A gate insulating layer and an FET were prepared and evaluated in the same manner as in Example 1 except that the obtained insulating material solution was used in according with "(2)-2 Preparation of the Gate Insulating Layer (b)", because the insulating material solution included a radical polymerizable compound.

Example 12

A gate insulating layer and an FET were prepared and evaluated in the same manner as in Example 1 except that when preparing the semiconductor solution, only CNT was used without using P3HT and this solution was used as the semiconductor solution B for formation of the semiconductor layer.

Example 13

By using the electric conductive paste including the photosensitive organic component, the electrode was prepared by the way as described below. Into a 100-mL clean bottle were introduced 20 g of acryl polymer (trade name of SPCR-69X; mass-average molecular weight of 15,000, manufactured by Showa Denko K. K.), 4 g of photopolymerization initiator (OXE-01, manufactured by BASF Japan Ltd.), 0.6 g of acid generator (SI-110, manufactured by Sanshin Chemical Industry Co., Ltd.), and 10 g of γ-butyrolactone (manufactured by Mitsubishi Gas Chemical Company, Inc.); and then, the resulting mixture was mixed by using a rotation and revolution vacuum mixer (registered trademark of "Awatori-Rentaro ARE-310", manufactured by Thinky Corp.) to obtain 46.6 g of photosensitive resin solution (solid component concentration of 78.5 mass %). A mixture of 8.0 g of the obtained photosensitive resin solution with 42.0 g of silver particles with the average particle size of 2 μm was kneaded with a three roll mill (trade name of "EXAKT M-50", manufactured by EXAKT GmbH) to obtain 50 g of photosensitive Ag paste A.

The photosensitive Ag paste A was applied onto a glass substrate by means of a screen printing method, and then, prebaked in a drying oven at 100° C. for 10 minutes. Then, by using an exposure apparatus (trade name of "PEM-8M"; manufactured by Union Optical Co., Ltd.), the all-wavelength exposure was carried out via a photomask having a mask pattern corresponding to the electrode with the exposure amount of 70 mJ/cm$^2$ (converted amount at the wavelength of 365 nm), followed by a dip development in a 0.5% Na$_2$CO$_3$ solution for 30 seconds. After rinsing with ultrapure water, curing was carried out in a drying oven at 140° C. for 30 minutes to obtain the gate electrode. Using the same procedure, the source electrode and drain electrode pattern was prepared. A gate insulating layer and an FET were prepared and evaluated in the same manner as in Example 1 except for these procedures.

Example 14

An FET was prepared and evaluated in the same manner as in Example 13 except that PS-03 was used as a polysiloxane having inorganic particles bound thereto.

Example 15

A gate insulating layer and an FET were prepared and evaluated in the same manner as in Example 1 except that a thicker coating was formed under the coating conditions of 200 rpm×15 seconds when the insulating material solution is applied by spin coating.

Comparative Example 1

An FET was prepared and evaluated in the same manner as in Example 1 except that a polymer having no inorganic particle bound thereto was obtained in accordance with the below-mentioned procedures and that an insulating material solution was obtained using the polymer.

In a three-neck flask, 10.90 g (0.08 mol) of MeSi, 5.25 g (0.02 mol) of SucSi, 24.84 g (0.10 mol) of NapSi, and 51.14 g of DAA were fed, and the resulting mixture was stirred at room temperature, during which a phosphoric acid aqueous solution of 0.205 g (0.50 mass % relative to the fed monomer) of phosphoric acid dissolved in 11.16 g of water was added over 10 minutes. Then, the resulting mixture was stirred for 60 minutes with the flask dipped in an oil bath at 40° C., and then, the oil bath temperature was raised to 115° C. over 30 minutes. The internal temperature of the solution reached 100° C. one hour after the start of temperature-raising, and then, the mixture was heated with stirring for 2 hours (the internal temperature was 100 to 110° C.). A resin solution obtained after the heating and stirring was cooled in an ice bath, and then, a negative ion exchange resin and a positive ion exchange resin, 2 wt % each relative to the resin solution, were added. The resulting mixture was stirred for 12 hours. After the stirring, the negative ion exchange resin and the positive ion exchange resin were removed by filtration to obtain a solution of polysiloxane (PS-11). In this regard, nitrogen was allowed to flow at 0.05 l (liter)/minute during the temperature-raising and heating/stirring. During the reaction, by-product methanol and water were distilled in a total amount of 19.82 g. The solid concentration of the obtained solution PS-11 of polysiloxane having no inorganic particle bound thereto was 33 mass %.

Comparative Example 2

An FET was prepared and evaluated in the same manner as in Comparative Example 1 except that 100 parts by mass of TR-550 (wherein, as the solvent, methanol was replaced with DAA using an evaporator) was added to 100 parts by mass of the polymer (PS-11) having no inorganic particle bound thereto to obtain an insulating material solution.

Comparative Example 3

A DAA dispersion liquid of TR-550 used in Comparative Example 2 was applied, by spin coating, directly on the glass substrate with the gate electrode 2 formed thereon to form a gate insulating layer. However, the film was so brittle that no electrode could be formed on the gate insulating layer, and that no evaluation of relative dielectric constant and FET characteristics could be carried out.

Comparative Example 4

A gate insulating layer and an FET were prepared and evaluated in the same manner as in Example 1 except that when preparing the semiconductor solution, only P3HT was used without using CNT and this solution was used as the semiconductor solution C to form a semiconductor layer.

Comparative Example 5

A gate insulating layer and an FET were prepared and evaluated in the same manner as in Example 1 except that when preparing the semiconductor solution, only fullerene (C60, having a purity of 99.95%, manufactured by Fujifilm Wako Pure Chemical Corporation) was used without using CNT and this solution was used as the semiconductor solution D to form a semiconductor layer.

The materials used in preparation of the FETs in Examples 1 to 15 and Comparative Examples 1 to 5 and the various evaluation results are summarized in Tables 1 to 4.

TABLE 1

Insulating Material Solution (Composition)

| | | Polysiloxane | | | | | | | |
|---|---|---|---|---|---|---|---|---|---|
| | | Silane Compound [mol %] | | | Inorganic Particle | | | | |
| | Composition | Compound corresponding to General Formula (1) | Compound corresponding to another Structural Unit | | [Mass Ratio wt % relative to Completely Condensed Silane Compound] | Another Polymer or Added Particle | Photoradical Generator or Photoacid Generator | Radical Polymerizable Compound | Surfactant | Solvent |
| Example 1 | PS-01 | SucSi [10] | MeSi [40] | NapSi [50] | TR-550 [100] | — | QD-01 | — | DFX-18 | DAA PGMEA |
| Example 2 | PS-02 | SucSi [10] | MeSi [40] | NapSi [50] | TR-550 [25] | — | QD-01 | — | DFX-18 | DAA PGMEA |
| Example 3 | PS-03 | SucSi [10] | MeSi [40] | NapSi [50] | TR-550 [150] | — | QD-01 | — | DFX-18 | DAA PGMEA |
| Example 4 | PS-04 | SucSi [10] | MeSi [40] | NapSi [50] | TR-550 [200] | — | QD-01 | — | DFX-18 | DAA PGMEA |
| Example 5 | PS-05 | SucSi [10] | MeSi [40] | NapSi [50] | TR-550 [300] | — | QD-01 | — | DFX-18 | DAA PGMEA |
| Example 6 | PS-06 | — | MeSi [60] | NapSi [40] | TR-550 [100] | — | QD-01 | — | DFX-18 | DAA PGMEA |
| Example 7 | PS-07 | SucSi [20] | MeSi [30] | NapSi [50] | TR-550 [100] | — | QD-01 | — | DFX-18 | DAA PGMEA |
| Example 8 | — | — | — | — | — | AC-TR550 | QD-01 | — | DFX-18 | DAA PGMEA |
| Example 9 | PS-8 | SucSi [10] | MeSi [40] | NapSi [50] | PL-2L-MA [100] | — | QD-01 | — | DFX-18 | DAA PGMEA |
| Example 10 | PS-9 | SucSi [10] | MeSi [40] | NapSi [50] | 1727BM [100] | — | QD-01 | — | DFX-18 | DAA PGMEA |

TABLE 2

Insulating Material Solution (Composition)

| | | Polysiloxane | | | | | | | |
|---|---|---|---|---|---|---|---|---|---|
| | | Silane Compound [mol %] | | | Inorganic Particle | | | | |
| | Composition | Compound corresponding to General Formula (1) | Compound corresponding to another Structural Unit | | [Mass Ratio wt % relative to Completely Condensed Silane Compound] | Another Polymer or Added Particle | Photoradical Generator or Photoacid Generator | Radical Polymerizable Compound | Surfactant | Solvent |
| Example 11 | PS-10 | SucSi [10] | AcrSi [40] | NapSi [50] | TR-550 [120] | — | OXE-01 | DPHA | DFX-18 | DAA PGMEA |
| Example 12 | PS-01 | SucSi [10] | MeSi [40] | NapSi [50] | TR-550 [100] | — | QD-01 | — | DFX-18 | DAA PGMEA |
| Example 13 | PS-01 | SucSi [10] | MeSi [40] | NapSi [50] | TR-550 [100] | — | QD-01 | — | DFX-18 | DAA PGMEA |
| Example 14 | PS-03 | SucSi [10] | MeSi [40] | NapSi [50] | TR-550 [150] | — | QD-01 | — | DFX-18 | DAA PGMEA |
| Example 15 | PS-01 | SucSi [10] | MeSi [40] | NapSi [50] | TR-550 [100] | — | QD-01 | — | DFX-18 | DAA PGMEA |
| Comparative Example 1 | PS-11 | SucSi [10] | MeSi [40] | NapSi [50] | — | — | QD-01 | — | DFX-18 | DAA PGMEA |
| Comparative Example 2 | PS-11 | SucSi [10] | MeSi [40] | NapSi [50] | — | TR-550 | QD-01 | — | DFX-18 | DAA PGMEA |
| Comparative Example 3 | — | — | — | — | — | TR-550 | — | — | — | DAA |
| Comparative Example 4 | PS-01 | SucSi [10] | MeSi [40] | NapSi [50] | TR-550 [100] | — | QD-01 | — | DFX-18 | DAA PGMEA |
| Comparative Example 5 | PS-01 | SucSi [10] | MeSi [40] | NapSi [50] | TR-550 [100] | — | QD-01 | — | DFX-18 | DAA PGMEA |

TABLE 3

| | Semiconductor Solution | Electrode Material | Gate Insulating Layer | | | | | Applicability of Semiconductor Solution [°] | FET Characteristics | |
| --- | --- | --- | --- | --- | --- | --- | --- | --- | --- | --- |
| | | | Structural Unit of General Formula (1) in Polysiloxane [mol %] | Relative Dielectric Constant [—] | Number-average Particle Size of Inorganic Particle [nm] | Volume Fraction of Inorganic Particle [vol %] | Thickness [nm] | | On-current [μA] | Leak Current [pA] |
| Example 1 | A | Au | 5 | 7.1 | 20 | 21 | 400 | A | A | A |
| Example 2 | A | Au | 5 | 4.5 | 20 | 5 | 400 | B | C | B |
| Example 3 | A | Au | 5 | 10.3 | 20 | 31 | 400 | A | A+ | A+ |
| Example 4 | A | Au | 5 | 14.5 | 20 | 42 | 400 | A | A | A |
| Example 5 | A | Au | 5 | 21.0 | 20 | 63 | 400 | C | B | B |
| Example 6 | A | Au | 0 | 7.0 | 20 | 20 | 400 | C | C | C |
| Example 7 | A | Au | 10 | 7.1 | 20 | 21 | 400 | A | A | A |
| Example 8 | A | Au | 0 | 7.0 | 20 | 20 | 400 | B | C | A |
| Example 9 | A | Au | 5 | 3.6 | 18 | 21 | 400 | A | C | A |
| Example 10 | A | Au | 5 | 3.6 | 120 | 21 | 400 | B | C | B |

TABLE 4

| | Semiconductor Solution | Electrode Material | Gate Insulating Layer | | | | | Applicability of Semiconductor Solution [°] | FET Characteristics | |
| --- | --- | --- | --- | --- | --- | --- | --- | --- | --- | --- |
| | | | Structural Unit of General Formula (1) in Polysiloxane [mol %] | Relative Dielectric Constant [—] | Number-average Particle Size of Inorganic Particle [nm] | Volume Fraction of Inorganic Particle [vol %] | Thickness [nm] | | On-current [μA] | Leak Current [pA] |
| Example 11 | A | Au | 5 | 7.0 | 20 | 20 | 400 | A | A | A |
| Example 12 | B | Au | 5 | 7.1 | 20 | 21 | 400 | B | B | A |
| Example 13 | A | Photo-sensitive Ag Paste | 5 | 7.1 | 20 | 21 | 400 | A+ | A+ | A |
| Example 14 | A | Photo-sensitive Ag Paste | 5 | 10.3 | 20 | 31 | 400 | A+ | A+ | A+ |
| Example 15 | A | Au | 5 | 7.1 | 20 | 21 | 1200 | A | B | A |
| Comparative Example 1 | A | Au | 5 | 7.0 | 20 | 0 | 400 | D | D | D |
| Comparative Example 2 | A | Au | 5 | 7.0 | 20 | 20 | 400 | E | D | E |
| Comparative Example 3 | A | Au | 0 | — | 20 | 100 | 400 | E | — | — |
| Comparative Example 4 | C | Au | 5 | 7.1 | 20 | 21 | 400 | E | E | D |
| Comparative Example 5 | D | Au | 5 | 7.1 | 20 | 21 | 400 | E | E | D |

REFERENCE SINGS LIST

1 Substrate
2 Gate electrode
3 Gate insulating layer
4 Semiconductor layer
5 Source electrode
6 Drain electrode
10 Antenna
11 Demodulation circuit
12 Control circuit
13 Modulation circuit
14 Memory circuit
15 Power source generating unit

The invention claimed is:
1. A field-effect transistor, comprising at least:
a substrate; a source electrode;
a drain electrode;
a gate electrode;
a semiconductor layer in contact with said source electrode and with said drain electrode; and
a gate insulating layer insulating between said semiconductor layer and said gate electrode;
wherein said semiconductor layer contains a carbon nanotube, and
wherein said gate insulating layer contains inorganic particles treated with a polysiloxane that has at least a structural unit represent by formula (1)

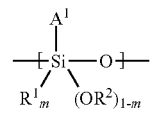
(1)

wherein, in formula (1),

R¹ represents a hydrogen atom, an alkyl group, a cycloalkyl group, a heterocyclic group, an aryl group, a heteroaryl group, or an alkenyl group;

R² represents a hydrogen atom, an alkyl group, a cycloalkyl group, or a silyl group;

m represents 0 or 1; and

A¹ represents an organic group including at least two groups selected from a carboxyl group, a sulfo group, a thiol group, a phenolic hydroxy group, or a derivative of these groups, wherein, when said derivative is a cyclic condensed structure formed by two of said carboxyl group, said sulfo group, said thiol group, and said phenolic hydroxy group, A¹ represents an organic group having at least one said cyclic condensed structure;

the treatment resulting in the inorganic particles and polysiloxane being bonded together.

2. The field-effect transistor according to claim 1, wherein said gate insulating layer has a relative dielectric constant within the range of at least 5 and up to 20.

3. The field-effect transistor according to claim 1, wherein said carbon nanotube includes a carbon nanotube composite having a conjugated polymer attached to at least part of the surface of said carbon nanotube.

4. The field-effect transistor according to claim 1, wherein said inorganic particles include a metal oxide.

5. The field-effect transistor according to claim 1, wherein said inorganic particles have a number-average particle size in the range of at least 1 nm and up to 100 nm.

6. The field-effect transistor according to claim 1, wherein the inorganic particles in said gate insulating layer have a volume fraction in the range of at least 10 vol % and up to 60 vol %.

7. The field-effect transistor according to claim 1, wherein said gate insulating layer has a thickness in the range of at least 10 nm and up to 1000 nm.

8. The field-effect transistor according to claim 1, wherein said source electrode and/or said drain electrode include(s) an organic binder and an electric conductive powder.

9. The field-effect transistor according to claim 1, wherein said field-effect transistor has an on-current of at least 5 µA and a leak current of up to 50 pA.

10. A method for producing the field-effect transistor according to claim 1, the method comprising the steps of:
(1) forming, on a substrate, an electric conductive pattern serving as a gate electrode;
(2) applying a solution including at least a polymer having inorganic particles bound thereto onto said substrate having said electric conductive pattern formed thereon, followed by drying said solution, to obtain a coating film; and
(3) forming, on said coating film or a gate insulating layer formed by curing said coating film, a semiconductor layer including a carbon nanotube and an electric conductive pattern serving as a source electrode and a drain electrode, in such a manner that said semiconductor layer and said electric conductive pattern are in contact with each other.

11. A wireless communication device comprising the field-effect transistor according to claim 1.

12. A goods tag comprising the wireless communication device according to claim 11.

13. A field-effect transistor, comprising at least:
a substrate; a source electrode;
a drain electrode;
a gate electrode;
a semiconductor layer in contact with said source electrode and with said drain electrode; and
a gate insulating layer that insulates between said semiconductor layer and said gate electrode;
wherein said semiconductor layer contains carbon nanotubes, and
wherein said gate insulating layer contains a polymer having inorganic particles bound thereto, and
wherein the gate insulating layer has an opening on the gate electrode.

14. A method for producing the field-effect transistor according to claim 13, the method comprising the steps of:
(1) forming, on a substrate, an electric conductive pattern serving as a gate electrode;
(2) applying a solution including at least a polymer having inorganic particles bound thereto and a photosensitive organic component onto said substrate having said electric conductive pattern formed thereon, followed by drying said solution, to obtain a coating film;
(3) forming, on said coating film or a gate insulating layer formed by curing said coating film, a semiconductor layer including a carbon nanotube and an electric conductive pattern serving as a source electrode and a drain electrode, in such a manner that said semiconductor layer and said electric conductive pattern are in contact with each other;
(4) irradiating a film with active actinic light via a photomask, said film being obtained by applying, onto said substrate having said electric conductive pattern formed thereon, said solution including said polymer having inorganic particles bound thereto and said photosensitive organic component, and by drying said film; and forming, on said electric conductive pattern, an insulating pattern having an opening, using an alkali solution; and
(5) heating said insulating pattern to form said gate insulating layer having an opening.

* * * * *